(12) United States Patent
Murata

(10) Patent No.: US 6,762,109 B2
(45) Date of Patent: Jul. 13, 2004

(54) METHOD OF MANUFACTURING SEMICONDUCTOR DEVICE WITH REDUCED NUMBER OF PROCESS STEPS FOR CAPACITOR FORMATION

(75) Inventor: Naofumi Murata, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/262,920

(22) Filed: Oct. 3, 2002

(65) Prior Publication Data

US 2003/0194840 A1 Oct. 16, 2003

(30) Foreign Application Priority Data

Apr. 16, 2002 (JP) ........................................ 2002-113348

(51) Int. Cl.[7] .............................................. H01L 21/20
(52) U.S. Cl. ...................... 438/396; 438/393; 438/394; 438/395; 438/250; 438/251; 438/252; 438/253; 438/386; 257/532; 257/528; 257/306; 257/379
(58) Field of Search ................................ 438/396, 393, 438/354, 395, 250, 251, 252, 253, 386, 957; 257/532, 528, 306, 379

(56) References Cited

U.S. PATENT DOCUMENTS 6,259,128 B1 * 7/2001 Adler et al. ................ 257/301
6,380,609 B1 * 4/2002 Prinslow et al. ............ 257/532
6,432,794 B1 * 8/2002 Lou ........................... 438/396
6,451,662 B1 * 9/2002 Chudzik et al. ............ 438/386
2003/0113974 A1 * 6/2003 Ning et al. .................. 438/379

* cited by examiner

Primary Examiner—Matthew Smith
Assistant Examiner—Belur V Keshavan
(74) Attorney, Agent, or Firm—Oblon, Spivak, McClelland, Maier & Neustadt, P.C.

(57) ABSTRACT

A method of manufacturing a semiconductor device and a method of forming a capacitor allow the formation of a high-performance capacitor without increasing the number of process steps. A silicide protection film (11c) is formed to cover a lower electrode (6) of a capacitor. The silicide protection film (11c) is formed during the process step of forming another silicide protection film (11a). An upper electrode (19) of the capacitor is formed of metal film and opposed to the lower electrode (6) with the silicide protection film (11c) sandwiched in between. A portion of the silicide protection film (11c) which is sandwiched between the upper electrode (19) and the lower electrode (6) serves as a capacitor dielectric film.

17 Claims, 48 Drawing Sheets

F I G . 18
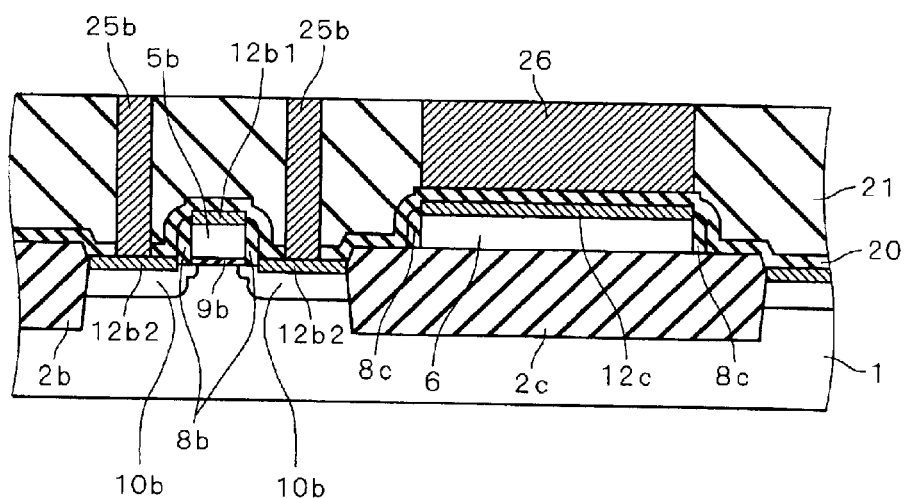

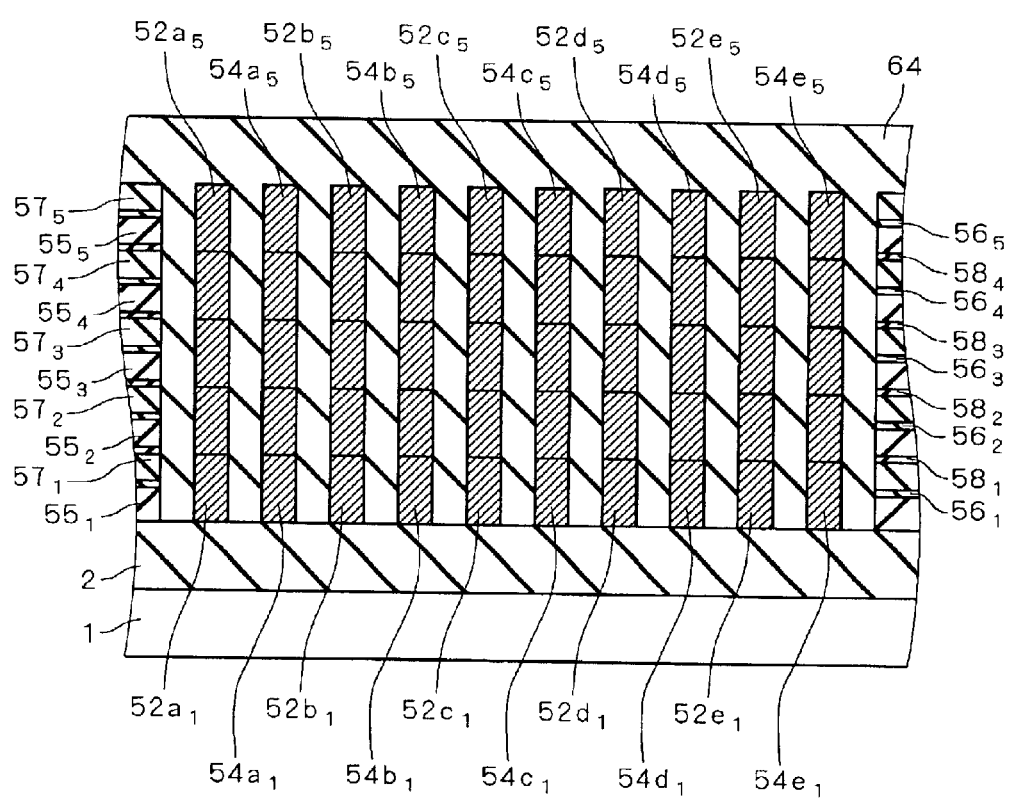
F I G . 4 2

< BACKGROUND ART >

< BACKGROUND ART >

< BACKGROUND ART >

< BACKGROUND ART >

< BACKGROUND ART >

< BACKGROUND ART >

< BACKGROUND ART >

< BACKGROUND ART >

F I G . 65
< BACKGROUND ART >
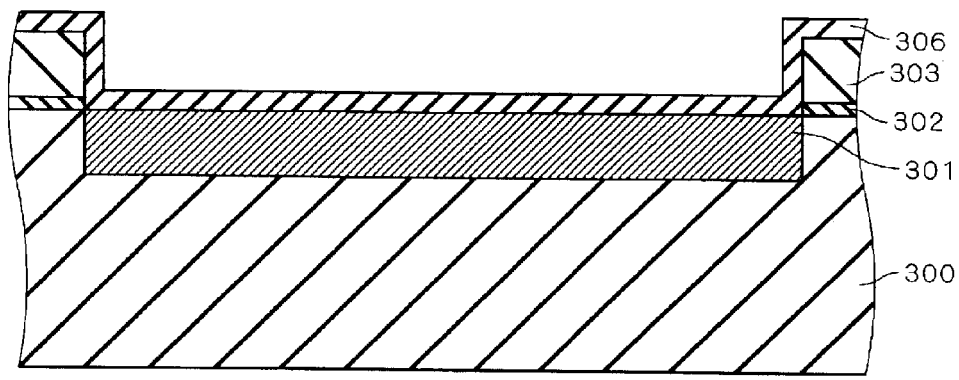
F I G . 66
< BACKGROUND ART >
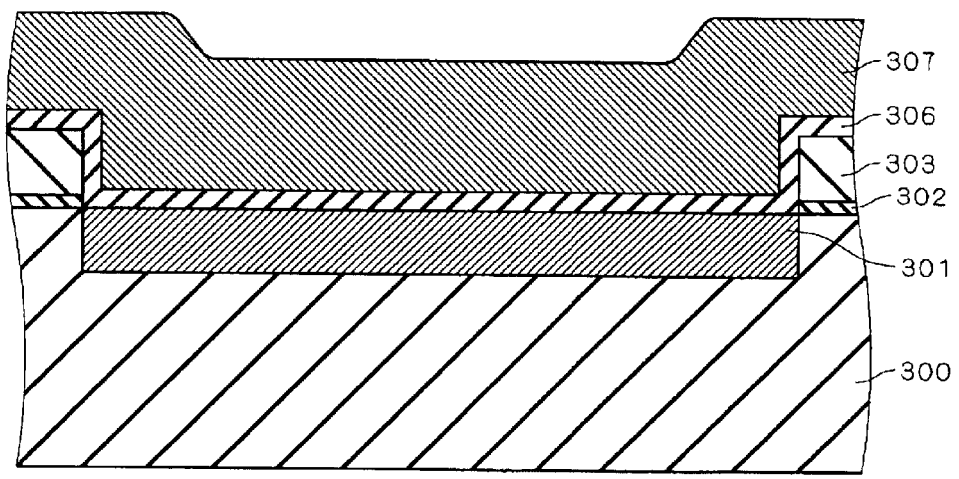

F I G . 6 7
< B A C K G R O U N D  A R T >
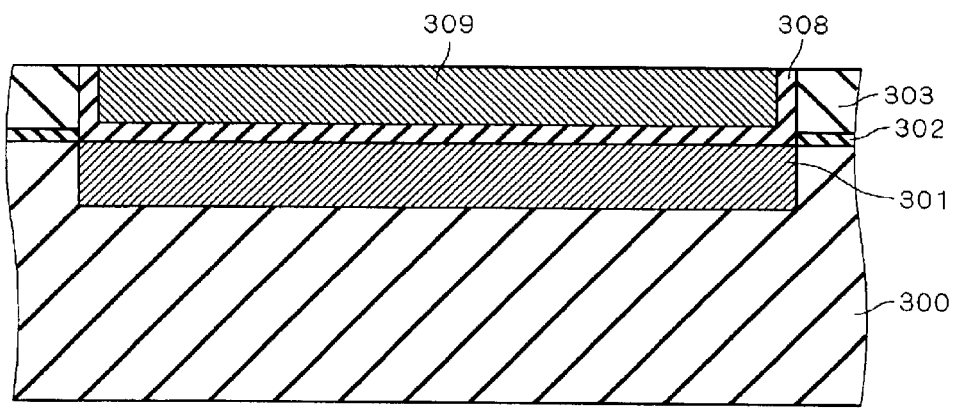

… … …

METHOD OF MANUFACTURING SEMICONDUCTOR DEVICE WITH REDUCED NUMBER OF PROCESS STEPS FOR CAPACITOR FORMATION

BACKGROUND OF THE INVENTION

1. Field of the Invention

The present invention relates to a method of manufacturing a semiconductor device and a method of forming a capacitor.

2. Description of the Background Art

FIGS. 57 to 61 are cross sectional views showing a sequence of process steps in a first conventional semiconductor device manufacturing method. First, referring to FIG. 57, an element isolation insulating film 201 is partially formed in the upper surface of a silicon substrate 200. Then, referring to FIG. 58, a polysilicon film 202 serving as a lower electrode of a capacitor is partially formed on the element isolation insulating film 201. Then, referring to FIG. 59, an insulation film 203 serving as a capacitor dielectric film is formed on the element isolation insulating film 201 to cover the polysilicon film 202. The insulation film 203 is, for example, an ON film formed by stacking silicon oxide film and silicon nitride film one above the other.

Referring next to FIG. 60, a silicon oxide film 204 is formed by thermal oxidation on an upper surface portion of the silicon substrate 200 where the element isolation insulating film 201 is not formed. After formation of a polysilicon film on the whole surface, the polysilicon film is patterned to form a gate electrode 205 and a polysilicon film 206 serving as an upper electrode of the capacitor. The polysilicon film 206 is opposed to the polysilicon film 202 with the insulation film 203 sandwiched in between. Then, referring to FIG. 61, source/drain regions 207 are formed in the upper surface of the silicon substrate 200 by ion implantation of impurities. At this time, impurities are also implanted into the gate electrode 205 and the polysilicon film 206.

FIGS. 62 to 67 are cross sectional views showing a sequence of process steps in a second conventional semiconductor device manufacturing method. First, referring to FIG. 62, a copper film 301 serving as a lower electrode of a capacitor is partially formed in the upper surface of an interlayer insulation film 300. Then, a capping film 302 of silicon nitride film is formed on the whole surface. In general, the capping film is formed to prevent copper atoms contained in a copper wire from diffusing into the interlayer insulation film. Then, referring to FIG. 63, a silicon oxide film 303 is formed on the capping film 302.

Referring next to FIG. 64, a photoresist 304 having a predetermined opening pattern is formed on the silicon oxide film 303. Using the photoresist 304 as an etch mask, the silicon oxide film 303 and the capping film 302 are etched to form a trench 305. Then, referring to FIG. 65, after removal of the photoresist 304, an insulation film 306 such as an ON film is formed on the whole surface.

Referring next to FIG. 66, by filling in the trench 305, a copper film 307 is formed on the whole surface. Then, referring to FIG. 67, the copper film 307 and the insulation film 306 are polished by CMP (Chemical Mechanical Polishing) until the upper surface of the silicon oxide film 303 is exposed. This forms an insulation film 308 serving as a capacitor dielectric film and a copper film 309 serving as an upper electrode of the capacitor in the trench 305.

Through the above process steps, an MIM (Metal Insulator Metal) type capacitor is formed by a damascene process.

According to the first conventional semiconductor device manufacturing method, impurities are introduced by ion implantation into the polysilicon film 206 serving as the upper electrode of the capacitor. Thus, the impurity concentration of the polysilicon film 206 in the bottom part is lower than that in the upper part. That is, the polysilicon film 206 has a low impurity concentration in a portion where it is in contact with the insulation film 203 serving as a capacitor dielectric film. This causes depletion of the polysilicon film 206 at the interface with the insulation film 203, thereby causing a problem of capacitor performance degradation such as variations in capacitance due to changes in the applied voltage or temperature.

According to the second conventional semiconductor device manufacturing method, on the other hand, since the upper electrode of the capacitor is formed of the copper film 309, the above problem of the first manufacturing method does not arise. This method, however, requires additional independent process steps for capacitor formation (FIGS. 63 to 67), aside from the process steps for interconnection formation, which causes a problem of increasing the total number of manufacturing process steps.

SUMMARY OF THE INVENTION

An object of the present invention is to provide a method of manufacturing a semiconductor device and a method of forming a capacitor which allow the formation of a high-performance capacitor without increasing the number of process steps.

According to an aspect of the present invention, the method of manufacturing a semiconductor device includes the following steps (a) to (g). The step (a) is to prepare a substrate. The step (b) is to partially form an element isolation insulating film in a main surface of the substrate. The step (c) is to form a first semiconductor element in a first element forming region defined by the element isolation insulating film, the first semiconductor element having first source/drain regions formed in the main surface. The step (d) is to form a first electrode of a capacitor. The step (e) is to form a silicide protection film of insulation film to cover the first electrode, but not to cover the first semiconductor element. The step (f) is to form a first silicide layer by silicidation of the first source/drain regions. The step (g) is to form a second electrode of the capacitor which is opposed to the first electrode with the silicide protection film sandwiched in between.

The silicide protection film serves as a capacitor dielectric film. Thus, the number of process steps can be reduced when compared with that in the case where a capacitor dielectric film is formed aside from a silicide protection film.

According to another aspect of the present invention, the method of manufacturing a semiconductor device includes the following steps (a) to (f). The step (a) is to prepare a substrate. The step (b) is to partially form an element isolation insulating film in a main surface of the substrate. The step (c) is to form a semiconductor element in a first element forming region defined by the element isolation insulating film, the semiconductor element having source/drain regions formed in the main surface. The step (d) is to form a first electrode of a capacitor. The step (e) is to form an etching stopper film of insulation film to cover the semiconductor element and the first electrode. The step (f) is to form a second electrode of the capacitor which is opposed to the first electrode with the etching stopper film sandwiched in between.

The etching stopper film serves as a capacitor dielectric film. Thus, the number of process steps can be reduced when compared with that in the case where a capacitor dielectric film is formed aside from an etching stopper film.

According to still another aspect of the present invention, the method of manufacturing a semiconductor device includes the following steps (a) to (c). The step (a) is to form a first metal film serving as a first interconnection and a second metal film serving as a first electrode of a capacitor, within a first interconnection layer. The step (b) is to form a capping film to cover the first and second metal films. The step (c) is to form a third metal film serving as a second electrode of the capacitor within a second interconnection layer formed on the first interconnection layer, the third metal film being opposed to the second metal film with the capping film sandwiched in between.

The capping film serves as a capacitor dielectric film. Thus, the number of process steps can be reduced when compared with that in the case where a capacitor dielectric film is formed aside from a capping film.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 14 to 18 are cross sectional views showing a sequence of process steps in a semiconductor device manufacturing method according to a second preferred embodiment of the present invention;

FIGS. 40 to 43 are cross sectional views showing a sequence of process steps in a method of forming a capacitor according to the sixth preferred embodiment of the present invention;

FIGS. 62 to 67 are cross sectional views showing a sequence of process steps in a second conventional semiconductor device manufacturing method.

DESCRIPTION OF THE PREFERRED EMBODIMENTS

First Preferred Embodiment

Figure 1:
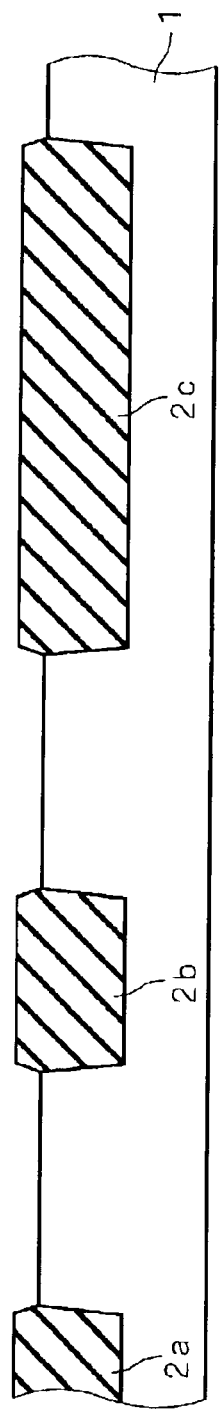
FIGS. 1 to 13 are cross sectional views showing a sequence of process steps in a semiconductor device manufacturing method according to a first preferred embodiment of the present invention.

FIGS. 1 to 13 are cross sectional views showing a sequence of process steps in a semiconductor device manufacturing method according to a first preferred embodiment of the present invention. First, referring to FIG. 1, element isolation insulating films 2a to 2c of silicon oxide film are formed in the upper surface of a silicon substrate 1.

Figure 2:
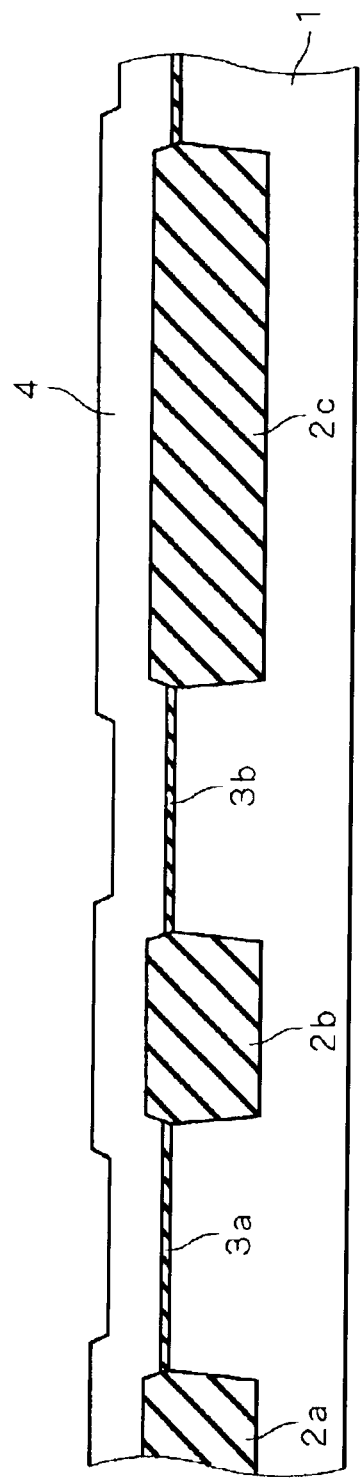

Referring next to FIG. 2, silicon oxide films 3a and 3b are formed by thermal oxidation on upper surface portions of the silicon substrate 1 where the element isolation insulating films 2a to 2c are not formed. The silicon oxide film 3a is formed in an element forming region defined by the element isolation insulating films 2a and 2b. The silicon oxide film 3b is formed in an element forming region defined by the element isolation insulating films 2b and 2c. Then, a polysilicon film 4 is formed by CVD on the whole surface. Then, n- or p-type impurities are introduced by ion implantation into the polysilicon film 4. At this time, the impurity concentration of the polysilicon film 4 in the upper part is higher than that in the bottom part. Alternatively, the upper surface of the polysilicon film 4 may be silicided, or a silicide film may be deposited on the upper surface of the polysilicon film 4.

Figure 3:
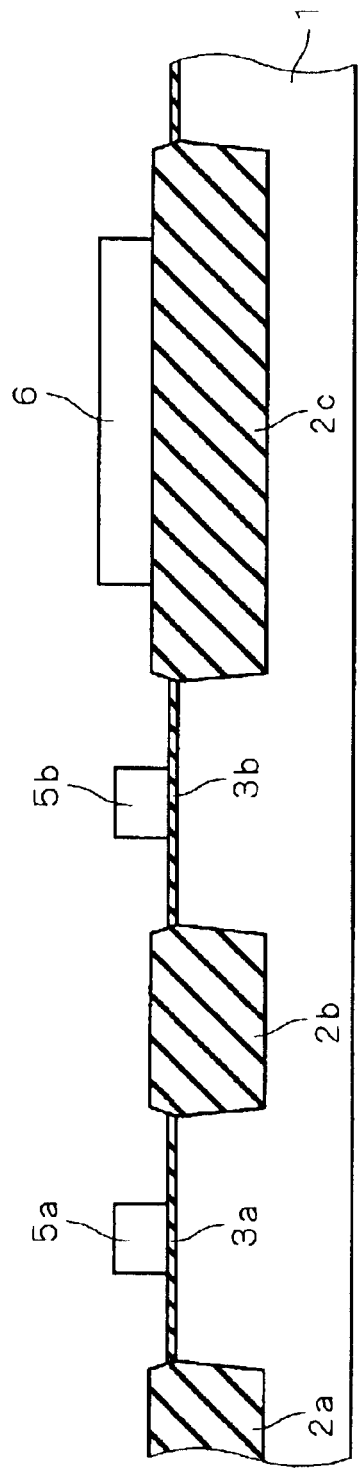

Referring next to FIG. 3, the polysilicon film 4 is patterned by photolithographic and anisotropic dry etching techniques to form gate electrodes 5a and 5b and a lower electrode 6 of a capacitor. The gate electrodes 5a and 5b are partially formed on the silicon oxide films 3a and 3b, respectively. The lower electrode 6 is partially formed on the element isolation insulating film 2c.

Figure 4:
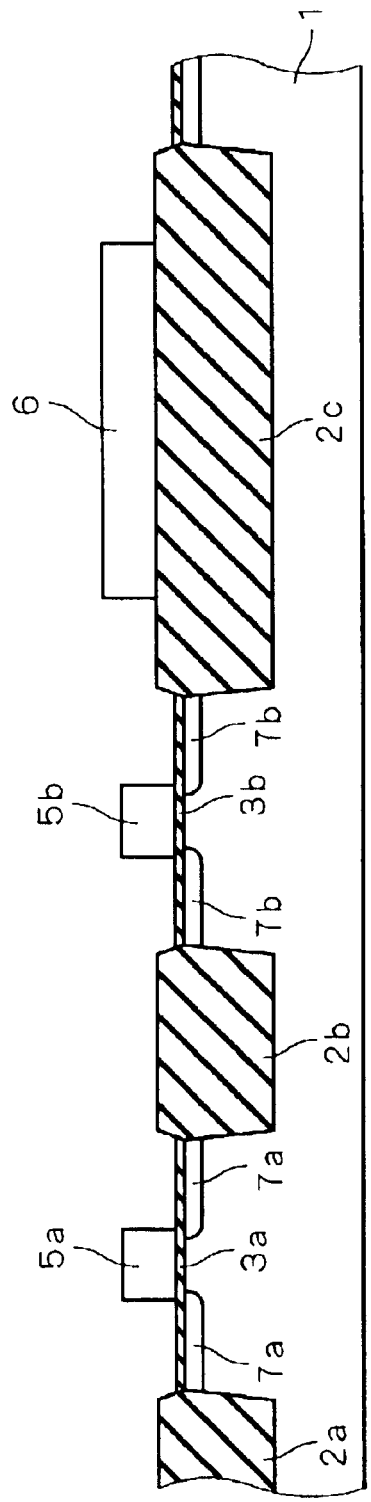

Referring next to FIG. 4, impurities are introduced by ion implantation into the upper surface of the silicon substrate 1 to form a pair of LDD regions 7a and a pair of LDD regions 7b. The pair of LDD regions 7a are opposed to each other with a channel forming region under the gate electrode 5a sandwiched in between. The pair of LDD regions 7b are opposed to each other with a channel forming region under the gate electrode 5b sandwiched in between.

Figure 5:
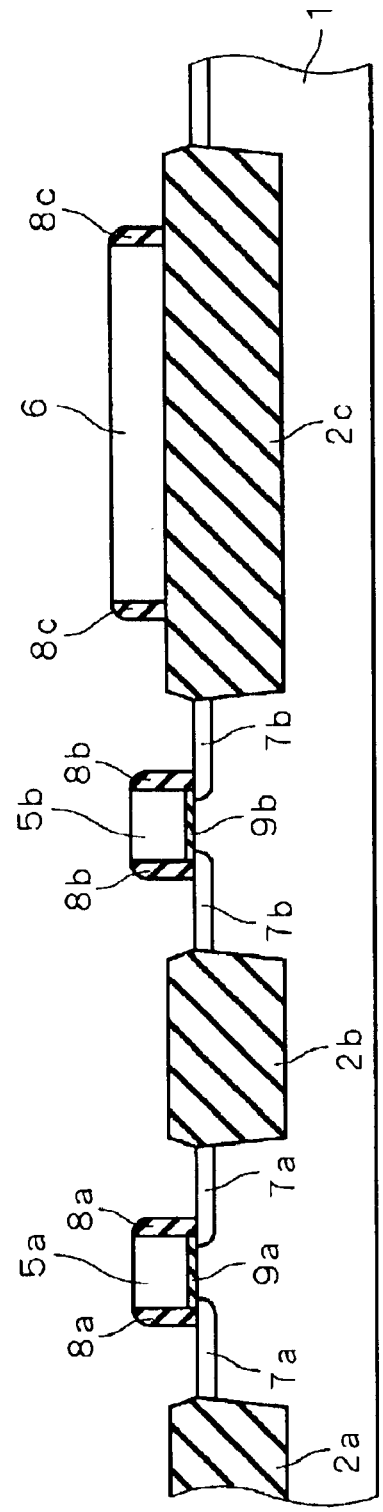

Referring next to FIG. 5, a silicon oxide film is formed by CVD on the whole surface. The silicon oxide film is then etched by anisotropic dry etching until the upper surface of the silicon substrate 1 is exposed, whereby sidewalls 8a to 8c are formed. The sidewalls 8a and 8b are formed on the sides of the gate electrodes 5a and 5b, respectively. The sidewall 8c is formed on the side of the lower electrode 6. Further, gate insulating films 9a and 9b are formed under the gate electrodes 5a and 5b, respectively.

Figure 6:
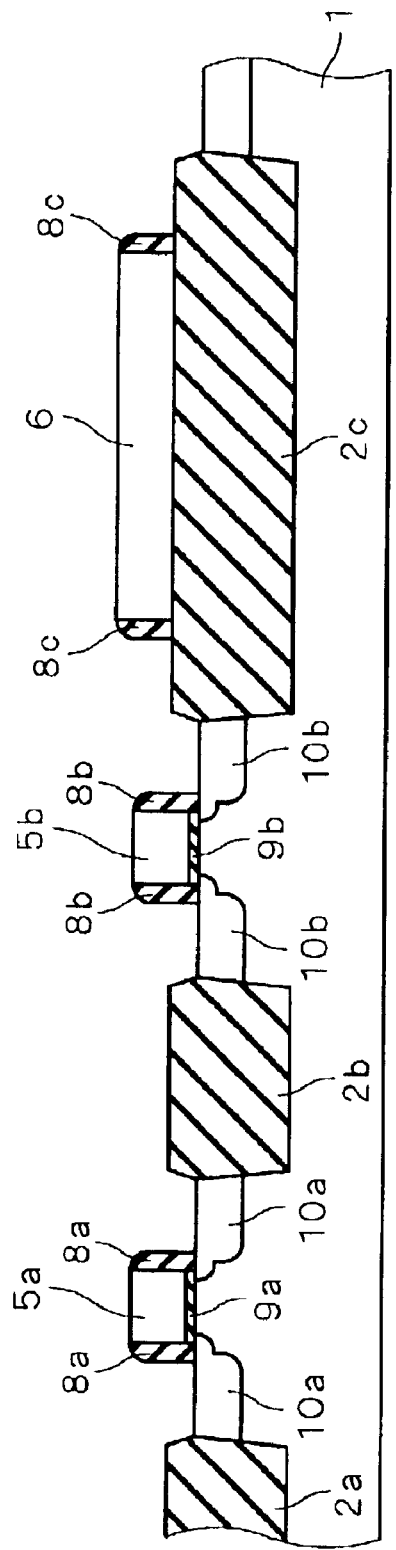

Referring next to FIG. 6, impurities are introduced by ion implantation into the upper surface of the silicon substrate 1 to form a pair of source/drain regions 10a and a pair of source/drain regions 10b. The pair of source/drain regions 10a is opposed to each other with the channel forming region under the gate electrode 5a sandwiched in between. The pair of source/drain regions 10b are opposed to each other with the channel forming region under the gate electrode 5b sandwiched in between. Thereby, a MOSFET (hereinafter referred to as a "first MOSFET") is formed in the element forming region defined by the element isolation insulating film 2b and 2c, and a MOSFET (hereinafter referred to as a "second MOSFET") is formed in the element forming region defined by the element isolation insulating films 2a and 2b.

Figure 7:
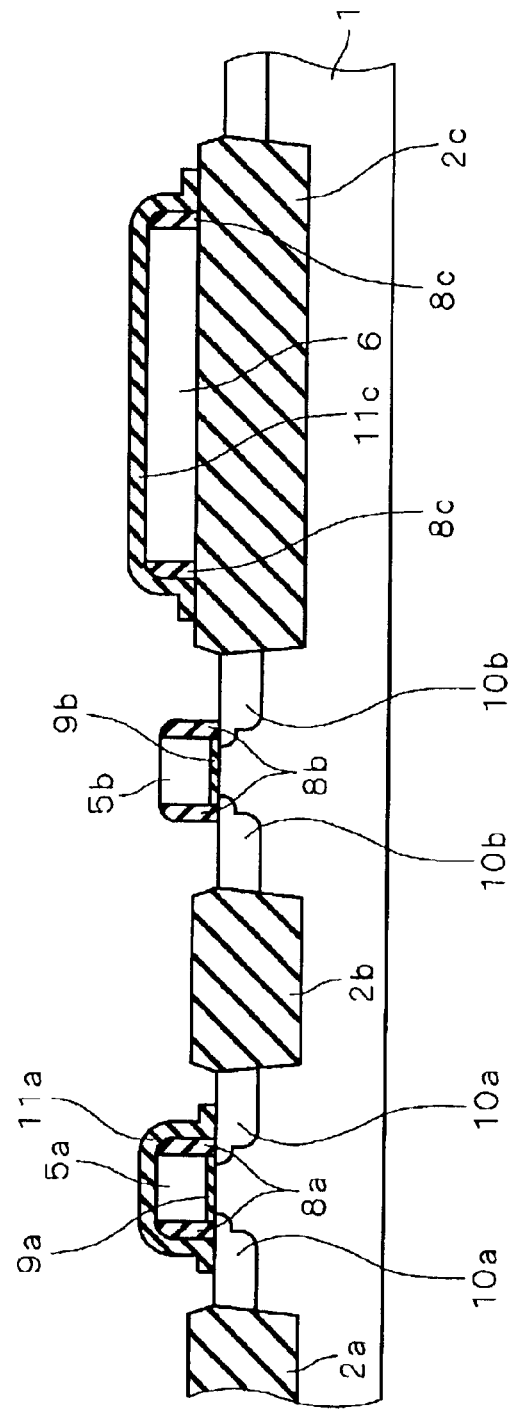

Referring next to FIG. 7, a silicon oxide film is formed by CVD on the whole surface. The silicon oxide film is then patterned by photolithographic and anisotropic dry etching techniques to form silicide protection films 11a and 11c. The silicide protection film 11a is formed to expose part of the upper surfaces of the source/drain regions 10a and to cover the second MOSFET. The silicide protection film 11c is formed to cover the lower electrode 6. The first MOSFET is not covered with the silicide protection films 11a and 11c.

Figure 8:
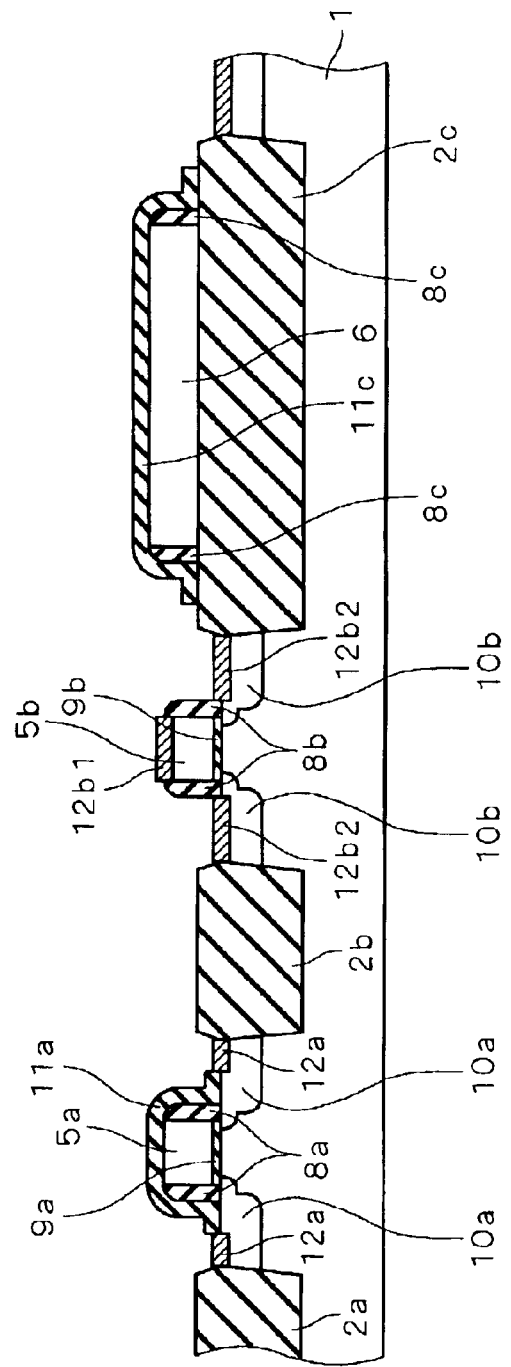

Referring next to FIG. 8, heat treatment is performed after a metal film such as cobalt is formed on the whole surface. Thereby, exposed upper surfaces portions of the source/drain regions 10a which are not covered with the silicide protection film 11a are silicided, forming silicide layers 12a. Also, the upper surfaces of the source/drain regions 10b are silicided, forming silicide layers 12b2. The upper surface of the gate electrode 5b is also silicided, forming a silicide layer 12b1. Thereafter, an unreacted metal film is removed.

Figure 9:
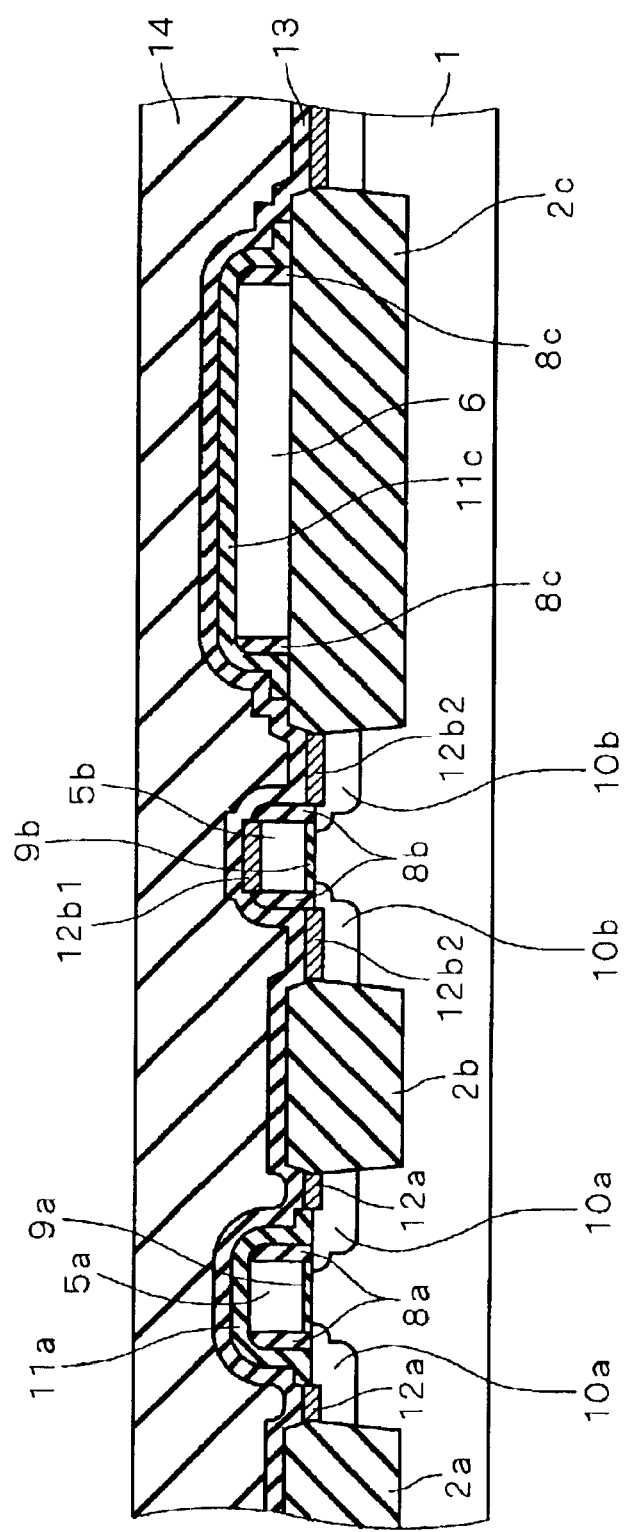

Referring next to FIG. 9, an etching stopper film 13 of silicon nitride film and an interlayer insulation film 14 of silicon oxide film are formed in this order on the whole surface by CVD.

Figure 10:
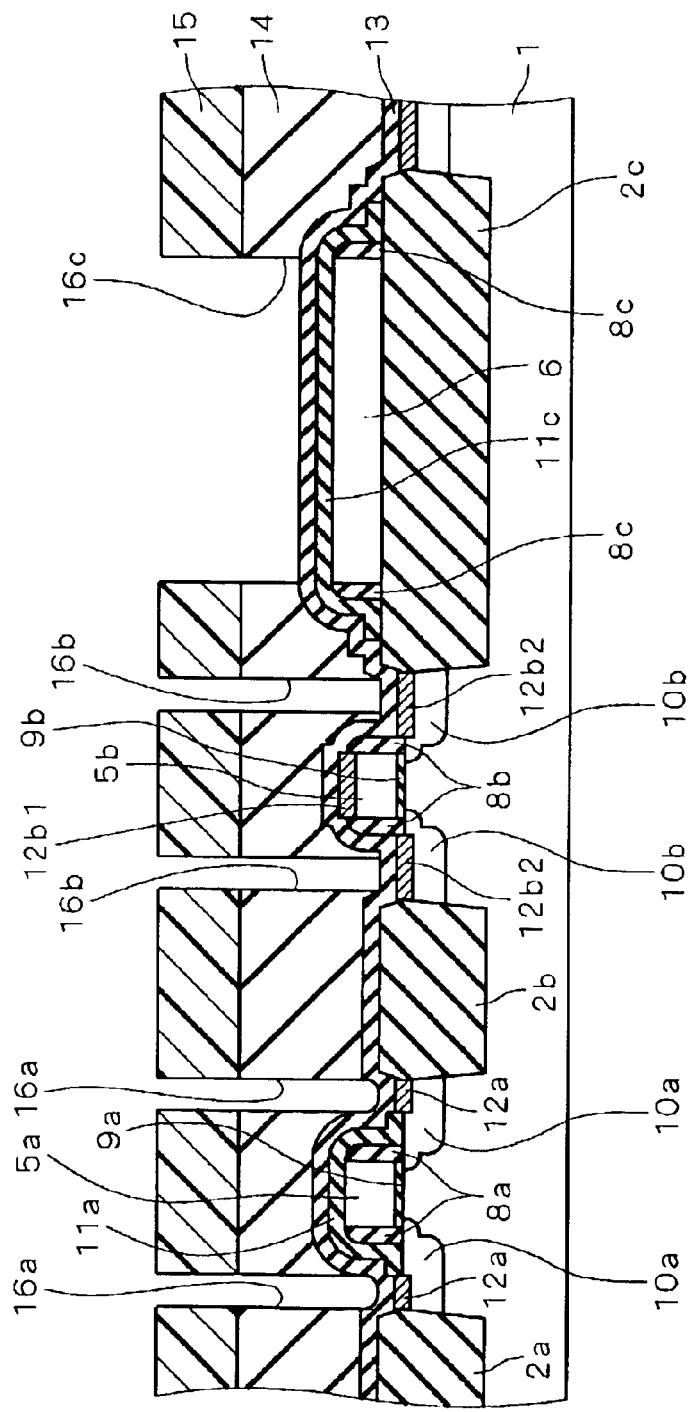

Referring next to FIG. 10, a photoresist 15 having a predetermined opening pattern is formed on the upper surface of the interlayer insulation film 14 by photolithographic techniques. Using the photoresist 15 as an etch mask, the interlayer insulation film 14 is removed by anisotropic dry etching until the upper surface of the etching stopper film 13 is exposed. This forms contact holes 16a and 16b above each of the silicide layers 12a and 12b2, respectively. Also, a trench 16c is formed above the lower electrode 6. The bottom surfaces of the contact holes 16a, 16b and the trench 16c are defined by the upper surface of the etching stopper film 13.

Figure 11:
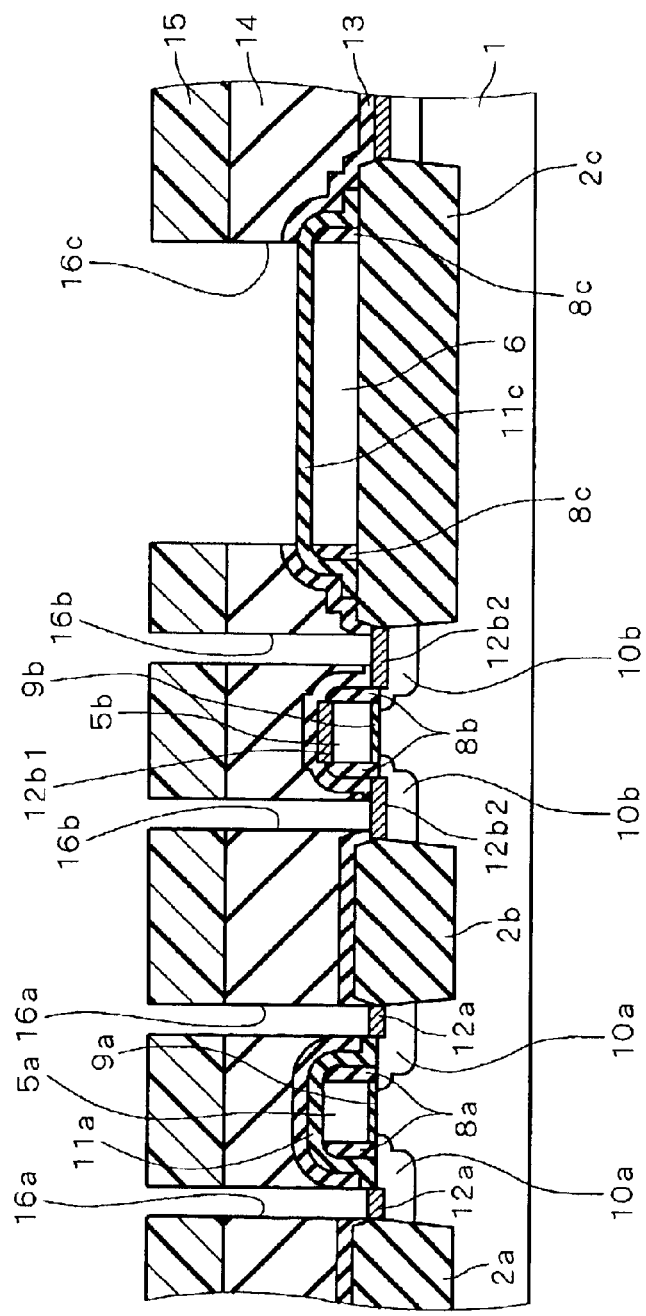

Referring next to FIG. 11, using the photoresist 15 as an etch mask, the etching stopper film 13 is removed by anisotropic dry etching. Thereby, portions of the etching stopper film 13 which define the bottom surfaces of the contact holes 16a and 16b are removed and the upper surfaces of the silicide layers 12a and 12b2 are exposed. Also, a portion of the etching stopper film 13 which defines the bottom surface of the trench 16c is removed and the upper surface of the silicide protection film 11c is exposed. As shown in FIG. 11, the bottom surfaces of the contact holes 16a and 16b are defined by the upper surfaces of the silicide layers 12a and 12b2, respectively. The bottom surface of the trench 16c is defined by the upper surface of the silicide protection film 11c.

Figure 12:
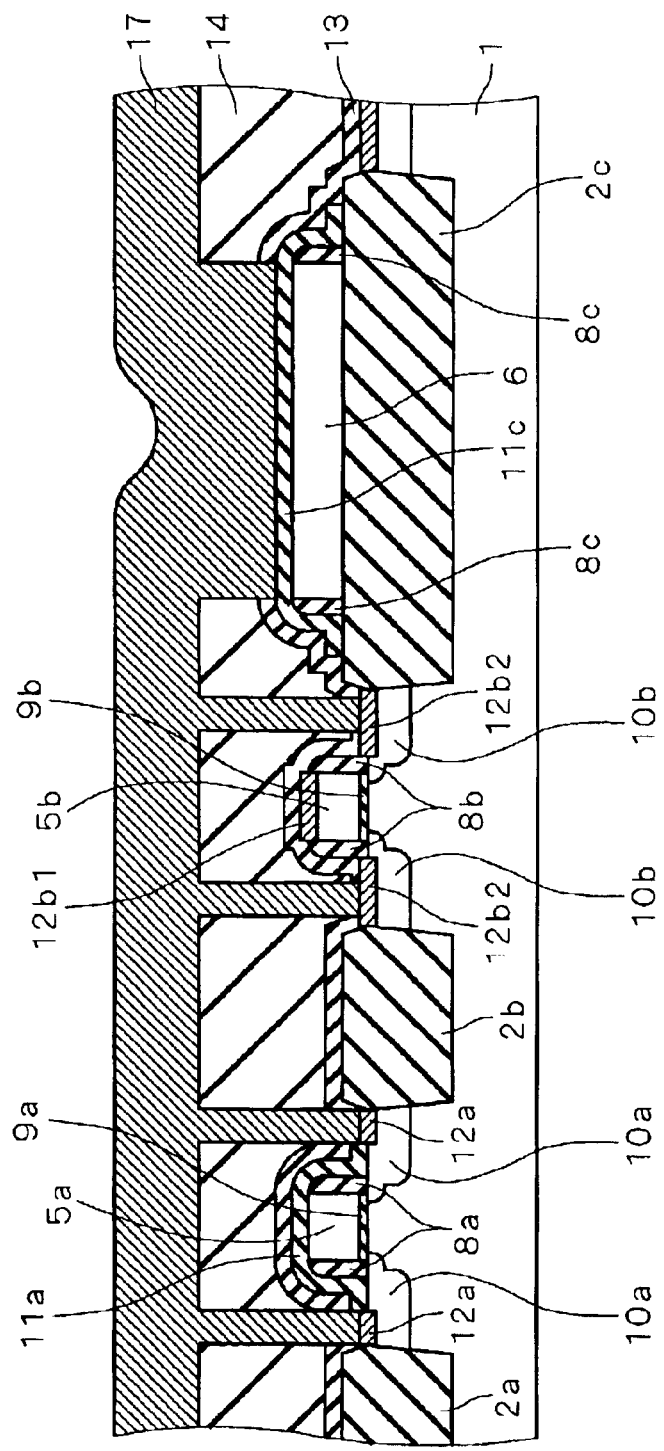

Referring next to FIG. 12, after removal of the photoresist 15, a metal film 17 such as tungsten is formed by CVD on the whole surface to such a film thickness as to completely fill in the contact holes 16a and 16b and the trench 16c.

Figure 13:
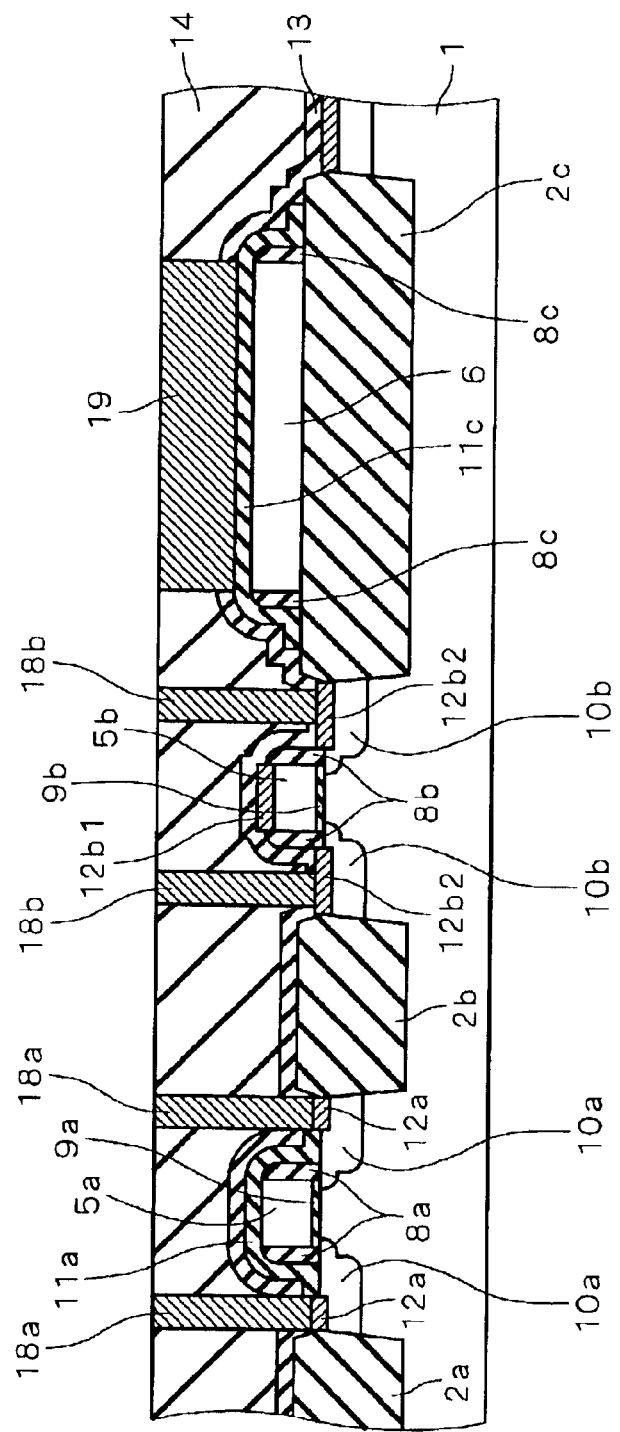
Figure 14:
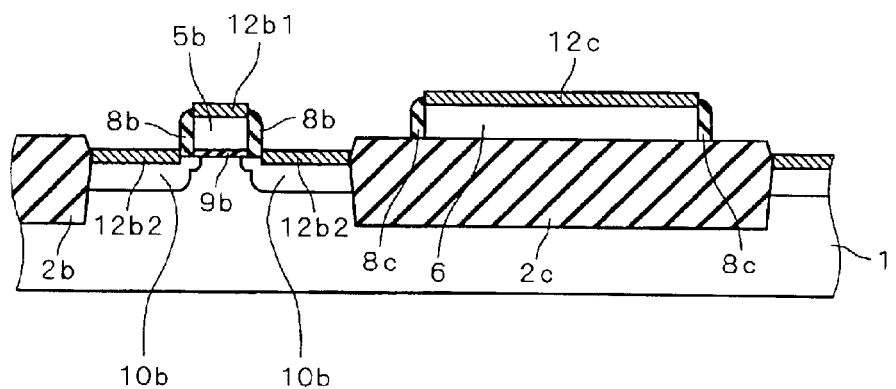

Referring next to FIG. 13, the metal film 17 is removed by etch back or CMP techniques until the upper surface of the interlayer insulation film 14 is exposed. This forms plugs 18a and 18b to fill in the contact holes 16a and 16b, respectively. Also, an upper electrode 19 of the capacitor is formed to fill in the trench 16c. The upper electrode 19 is opposed to the lower electrode 6 with the silicide protection film 11c sandwiched in between. A portion of the silicide protection film 11c which is sandwiched between the upper electrode 19 and the lower electrode 6 serves as a capacitor dielectric film.

In this semiconductor device manufacturing method according to the first preferred embodiment of the present invention, since the lower electrode 6 has a high impurity concentration in the upper part, no depletion of the lower electrode 6 occurs at the interface with the silicide protection film 11c. Also, since the upper electrode 19 is formed of metal film, no depletion of the upper electrode 19 occurs at the interface with the silicide protection film 11c. Accordingly, a high-performance capacitor can be produced which has no variations in capacitance even with changes in the applied voltage or temperature.

Besides, the lower electrode 6 can be formed during the process step of forming the gate electrodes 5a and 5b. The silicide protection film 11c serving as a capacitor dielectric film can be formed during the process step of forming the silicide protection film 11a. The trench 16c used for the upper electrode can be formed during the process step of forming the contact holes 16a and 16b used for the plug. The upper electrode 19 can be formed during the process step of forming the plugs 18a and 18b. Therefore, no additional process steps are required for capacitor formation, which prevents an increase in the number of process steps.

Second Preferred Embodiment

FIGS. 14 to 18 are cross sectional views showing a sequence of process steps in a semiconductor device manufacturing method according to a second preferred embodiment of the present invention. First, referring to FIG. 14, the element isolation insulating films 2b and 2c, the gate electrode 5b, the lower electrode 6, the sidewalls 8b and 8c, the gate insulating film 9b, and the source/drain regions 10b are formed in the same manner as in the aforementioned first preferred embodiment. Then, heat treatment is performed after a metal film such as cobalt is formed on the whole surface. Thereby, the upper surfaces of the source/drain regions 10b are silicided, forming the silicide layers 12b2. Also, the upper surface of the gate electrode 5b is silicided, forming the silicide layer 12b1. The upper surface of the lower electrode 6 is also silicided, forming a silicide layer 12c. Thereafter, an unreacted metal film is removed. The silicide layers 12b1, 12b2 and 12c may be formed by patterning a silicide film deposited on the whole surface.

Figure 15:
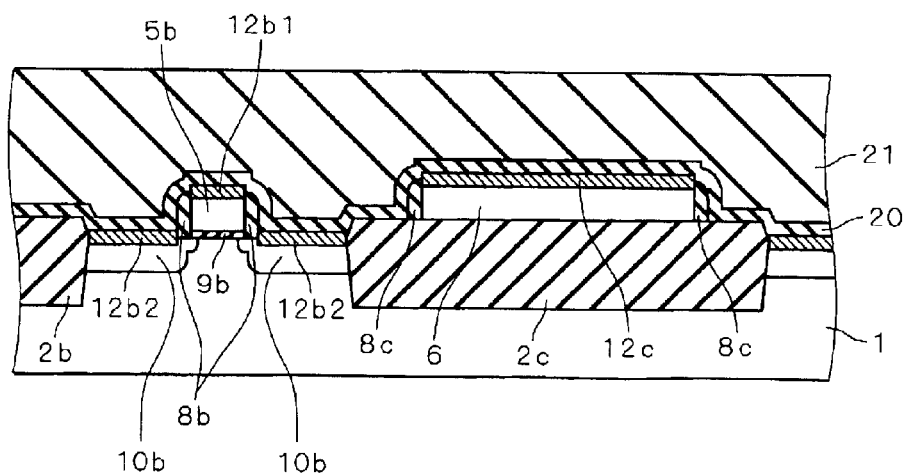

Referring next to FIG. 15, an etching stopper film 20 of silicon nitride film and an interlayer insulation film 21 of silicon oxide film are formed on the whole surface by CVD in this order.

Figure 16:
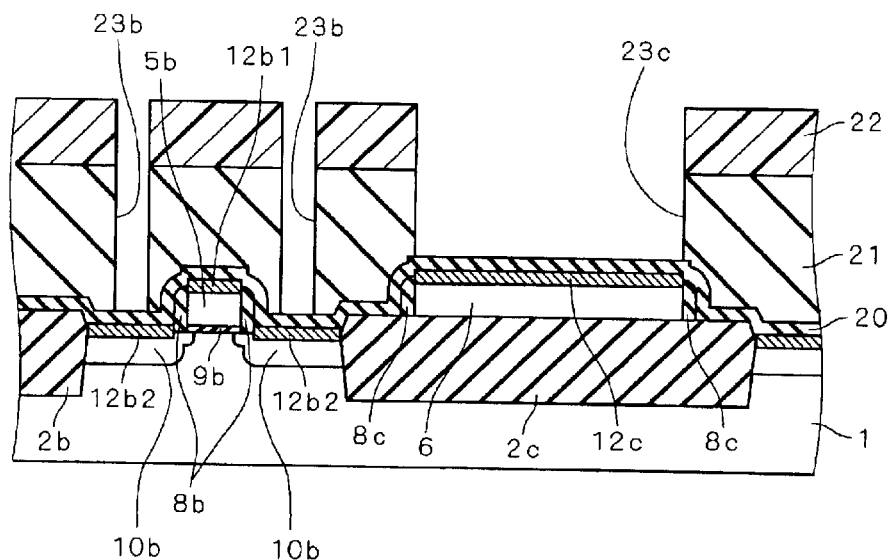

Referring next to FIG. 16, a photoresist 22 having a predetermined opening pattern is formed on the upper surface of the interlayer insulation film 21 by photolithographic techniques. Then, using the photoresist 22 as an etch mask, the interlayer insulation film 21 is removed by anisotropic dry etching until the upper surface of the etching stopper film 20 is exposed. This forms contact holes 23b above the silicide layers 12b2. Also, a trench 23c is formed above the silicide layer 12c. The bottom surfaces of the contact holes 23b and the trench 23c are defined by the upper surface of the etching stopper film 20.

Figure 17:
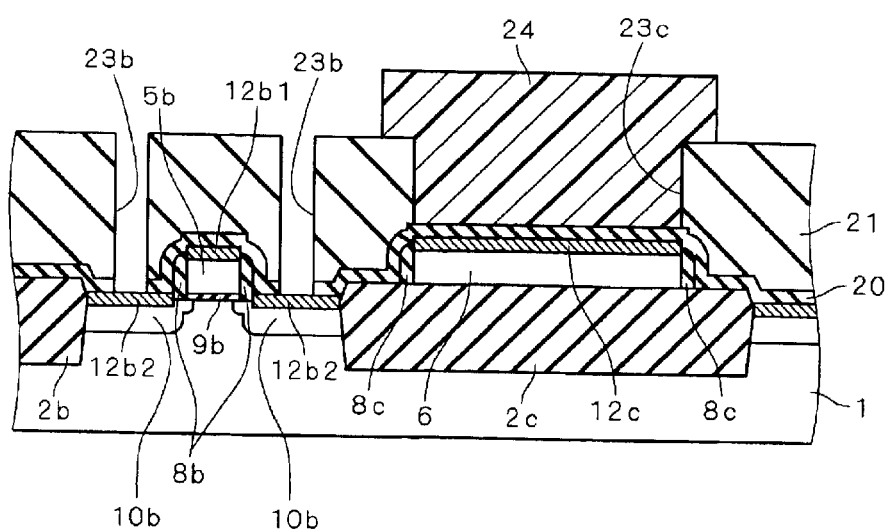
Figure 19:
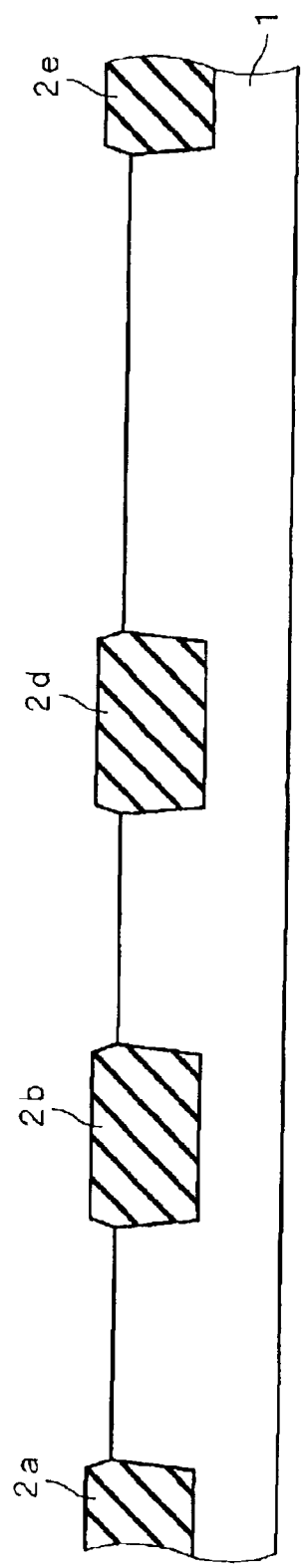
FIGS. 19 to 26 are cross sectional views showing a sequence of process steps in a semiconductor device manufacturing method according to a third preferred embodiment of the present invention.

Referring next to FIG. 17, a photoresist 24 is formed by photolithographic techniques to fill in the trench 23c. An upper surface portion of the etching stopper film 20 on the silicide layer 12c is covered with the photoresist 24. Then, using the photoresist 24 as an etch mask, an exposed portion of the etching stopper film 20 which is not covered with the photoresist 24 and the interlayer insulation film 21 is removed by anisotropic dry etching. Thereby, portions of the etching stopper film 20 which define the bottom surfaces of the contact holes 23b are removed and the upper surfaces of the silicide layers 12b2 are exposed. As shown in FIG. 17, the bottom surfaces of the contact holes 23b are defined by the upper surfaces of the silicide layers 12b2.

Referring next to FIG. 18, after removal of the photoresist 24, a metal film such as tungsten is formed by CVD on the whole surface to such a film thickness as to completely fill in the contact holes 23b and the trench 23c. The metal film is then removed by etch back or CMP techniques until the upper surface of the interlayer insulation film 21 is exposed. This forms plugs 25b to fill in the contact holes 23b. Also, an upper electrode 26 of the capacitor is formed to fill in the trench 23c. The upper electrode 26 is opposed to the silicide layer 12c with the etching stopper film 20 sandwiched in between. A portion of the etching stopper film 20 which is sandwiched between the upper electrode 26 and the silicide layer 12c serves as a capacitor dielectric film.

In this semiconductor device manufacturing method according to the second preferred embodiment of the present invention, since the lower electrode 6 has a high impurity concentration in the upper part and the silicide layer 12c is formed on the lower electrode 6, no depletion of the lower electrode 6 occurs at the interface with the etching stopper film 20. Also, since the upper electrode 26 is formed of metal film, no depletion of the upper electrode 26 occurs at the interface with the etching stopper film 20. Therefore, a high-performance capacitor can be produced which has no variations in capacitance even with changes in the applied voltage or temperature.

Besides, the lower electrode 6 can be formed during the process step of forming the gate electrode 5b. The etching stopper film 20 on the silicide layer 12c can be formed during the process step of forming the etching stopper film 20 on the silicide layers 12b2. The trench 23c used for the upper electrode can be formed during the process step of forming the contact holes 23b used for the plug. The upper electrode 26 can be formed during the process step of forming the plugs 25b. Therefore, no additional process steps are required for capacitor formation, which prevents an increase in the number of process steps.

Third Preferred Embodiment

FIGS. 19 to 26 are cross sectional views showing a sequence of process steps in a semiconductor device manufacturing method according to a third preferred embodiment of the present invention. First, referring to FIG. 19, element isolation insulating films 2a, 2b, 2d and 2e of silicon oxide film are partially formed in the upper surface of the silicon substrate 1.

Figure 20:
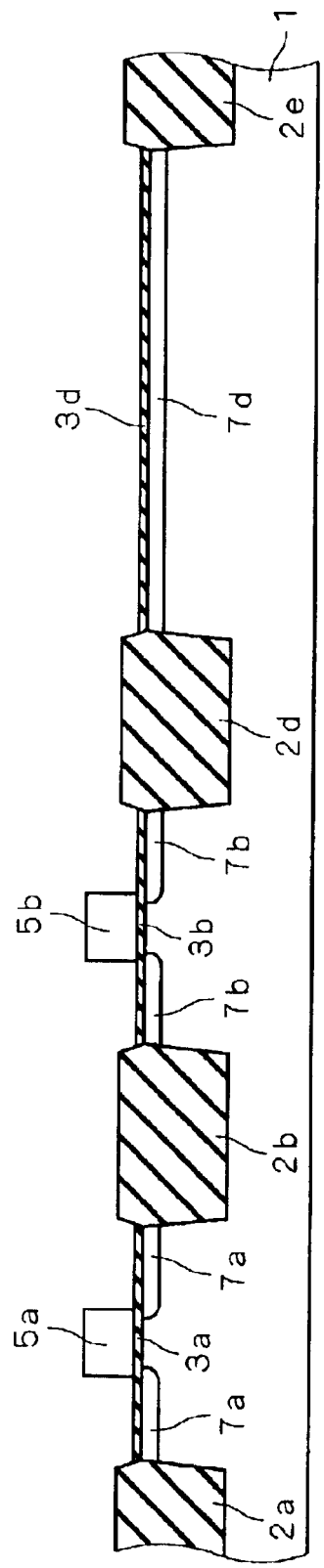

Referring next to FIG. 20, silicon oxide films 3a, 3b and 3d are formed by thermal oxidation on upper surface portions of the silicon substrate 1 where the element isolation insulating films 2a, 2b, 2d and 2e are not formed. The silicon oxide film 3b is formed in an element forming region defined by the element isolation insulating films 2b and 2d. The silicon oxide film 3d is formed in an element forming region defined by the element isolation insulating films 2d and 2e. Then, the gate electrodes 5a and 5b are formed on the silicon oxide films 3a and 3b, respectively. Impurities are then introduced by ion implantation into the upper surface of the silicon substrate 1 to form the LDD regions 7a and 7b and an impurity-doped region 7d. The impurity-doped region 7d is formed in the element forming region defined by the element isolation insulating films 2d and 2e.

Figure 21:
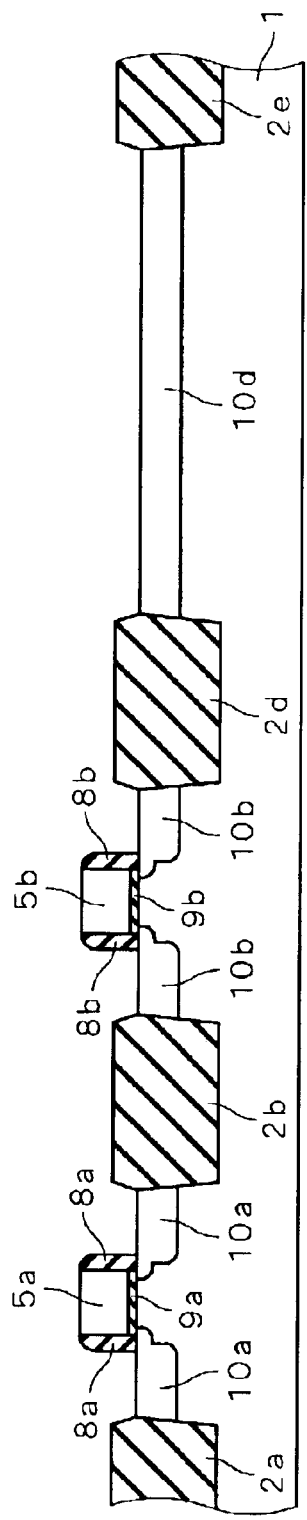

Referring next to FIG. 21, the sidewalls 8a and 8b are formed. Then, impurities are introduced by ion implantation into the upper surface of the silicon substrate 1 to form the source/drain regions 10a and 10b and an impurity-doped region 10d serving as a lower electrode of a capacitor. The impurity-doped region 10d is formed in the element forming region defined by the element isolation insulating films 2d and 2e.

Figure 22:
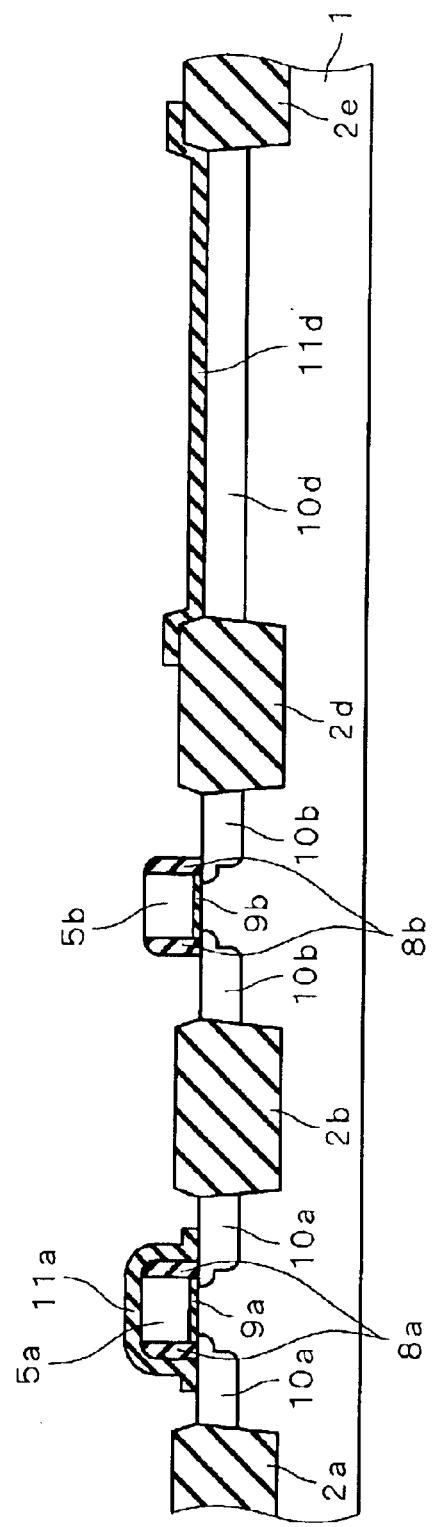

Referring next to FIG. 22, a silicon oxide film is formed by CVD on the whole surface. The silicon oxide film is then patterned by photolithographic and anisotropic dry etching techniques to form silicide protection films 11a and 11d. The silicide protection film 11d is formed to cover the impurity-doped region 10d.

Figure 23:
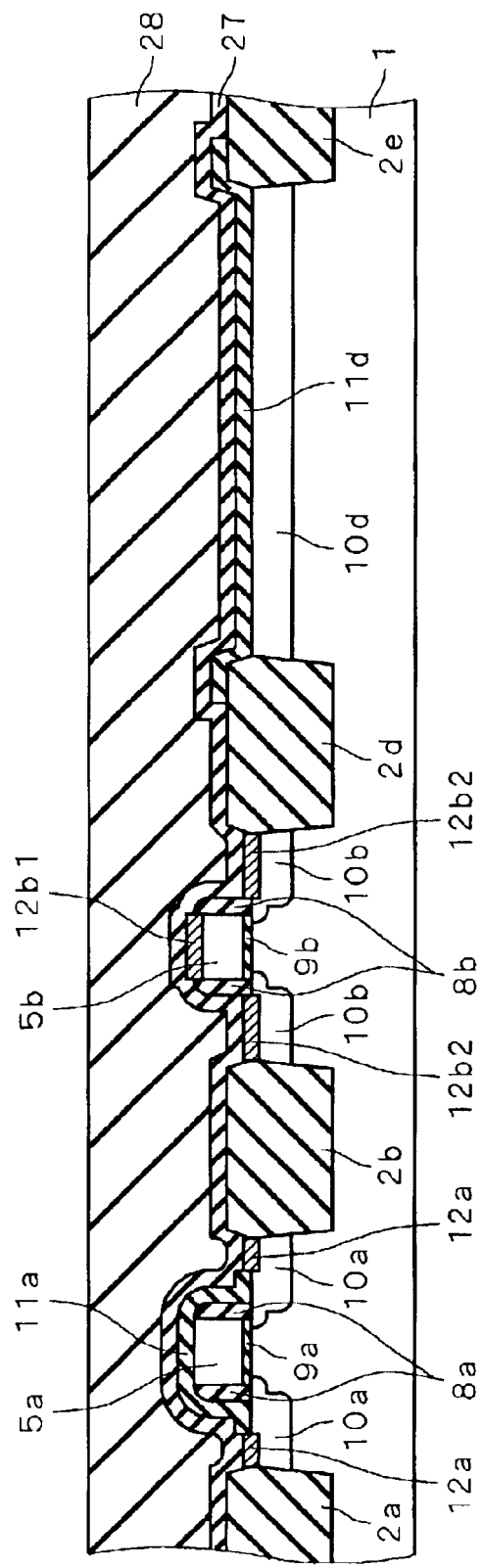

Referring next to FIG. 23, heat treatment is performed after a metal film such as cobalt is formed on the whole surface. This forms the silicide layers 12a, 12b1 and 12b2. Thereafter, an unreacted metal film is removed. Then, an etching stopper film 27 of silicon nitride film and an interlayer insulation film 28 of silicon oxide film are formed on the whole surface by CVD in this order.

Figure 24:
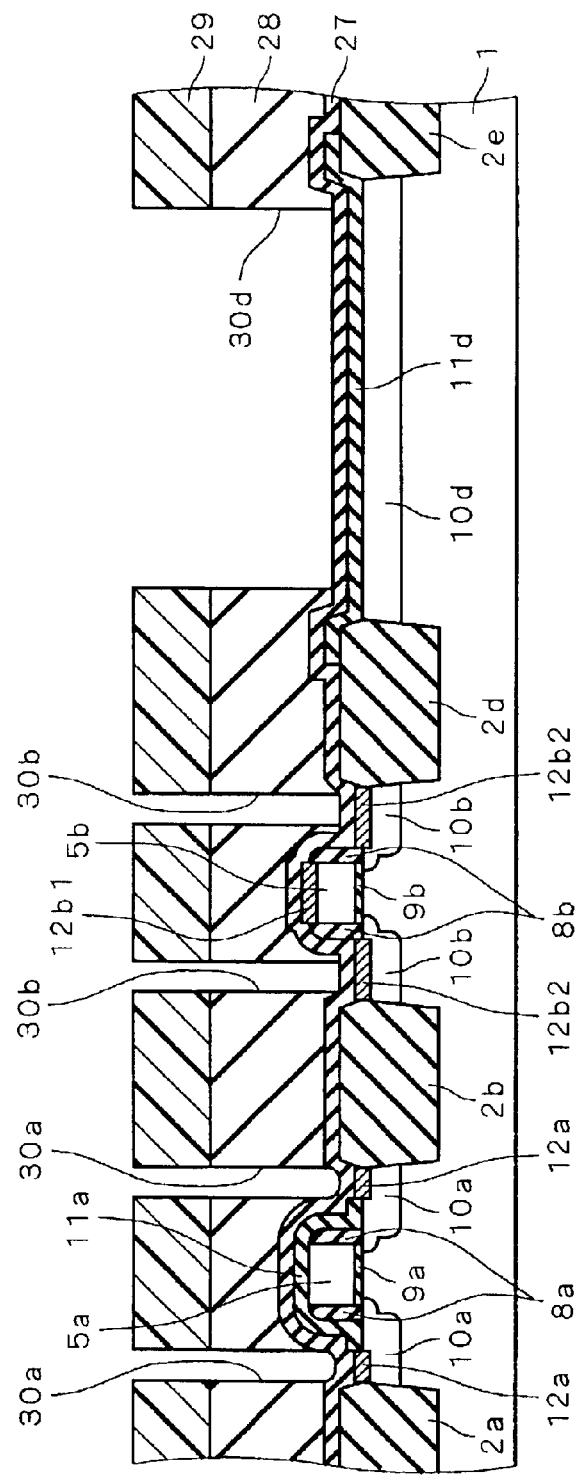

Referring next to FIG. 24, a photoresist 29 having a predetermined opening pattern is formed on the upper surface of the interlayer insulation film 28 by photolithographic techniques. Then, using the photoresist 29 as an etch mask, the interlayer insulation film 28 is then removed by anisotropic dry etching until the upper surface of the etching stopper film 27 is exposed. This forms contact holes 30a and 30b above the silicide layers 12a and 12b2, respectively. Also, a trench 30d is formed above the impurity-doped region 10d. The bottom surfaces of the contact holes 30a and 30b and the trench 30d are defined by the upper surface of the etching stopper film 27.

Figure 25:
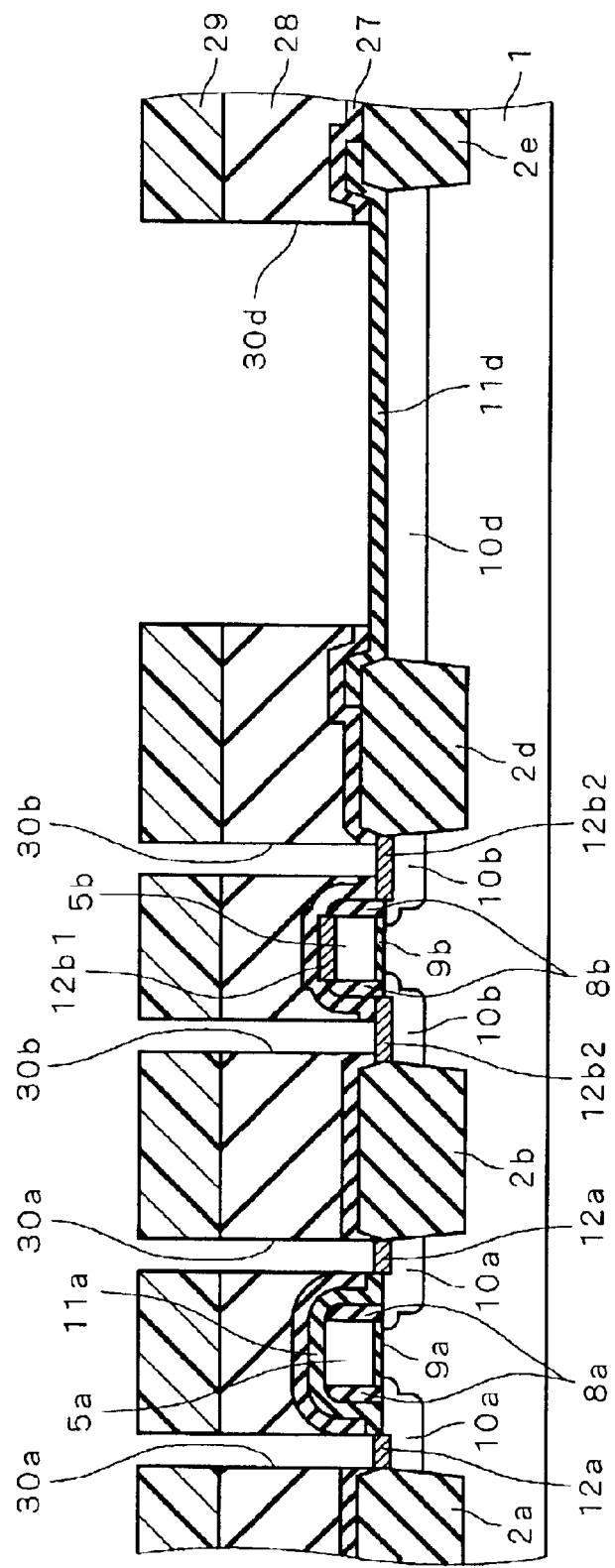

Referring next to FIG. 25, using the photoresist 29 as an etch mask, the etching stopper film 27 is removed by anisotropic dry etching. Thereby, portions of the etching stopper film 27 which define the bottom surfaces of the contact holes 30a and 30b are removed and the upper surfaces of the silicide layers 12a and 12b2 are exposed. Also, a portion of the etching stopper film 27 which defines the bottom surface of the trench 30d is removed and the upper surface of the silicide protection film 11d is exposed. As shown in FIG. 25, the bottom surfaces of the contact holes 30a and 30b are defined by the upper surfaces of the silicide layers 12a and 12b2, respectively. The bottom surface of the trench 30d is defined by the upper surface of the silicide protection film 11d.

Figure 26:
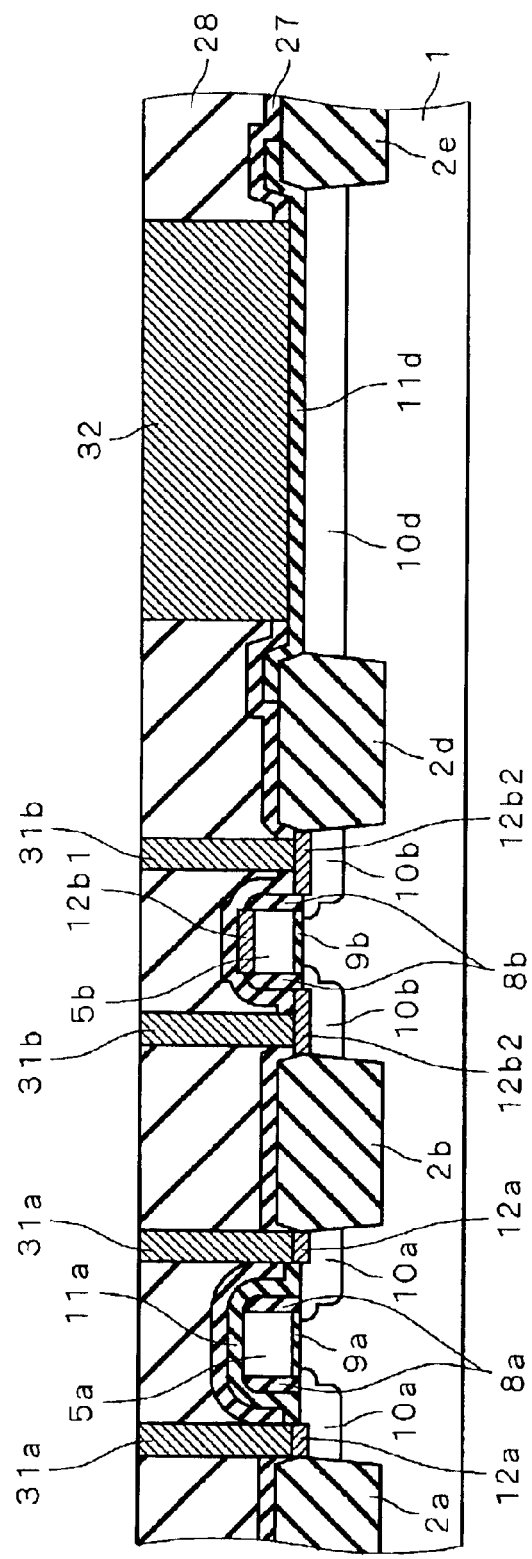
Figure 27:
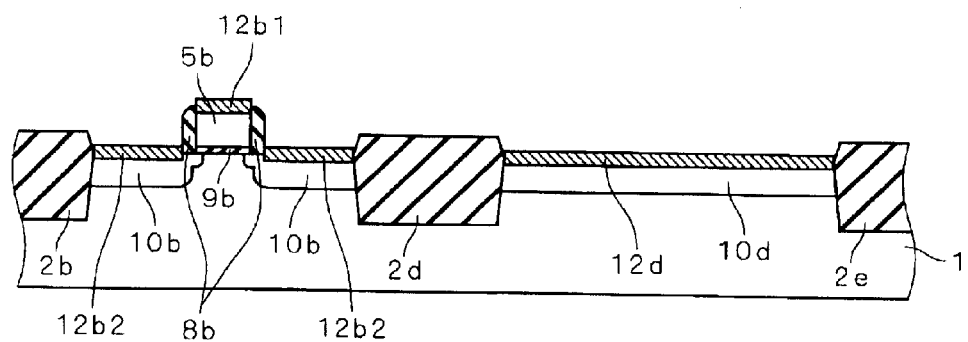
FIGS. 27 to 31 are cross sectional views showing a sequence of process steps in a semiconductor device manufacturing method according to a fourth preferred embodiment of the present invention.

Referring next to FIG. 26, after removal of the photoresist 29, a metal film such as tungsten is formed by CVD on the whole surface to such a film thickness as to completely fill in the contact holes 30a and 30b and the trench 30d. The metal film is then removed by etch back or CMP techniques until the upper surface of the interlayer insulation film 28 is exposed. This forms plugs 31a and 31b to fill in the contact holes 30a and 30b, respectively. Also, an upper electrode 32 of the capacitor is formed to fill in the trench 30d. The upper electrode 32 is opposed to the impurity-doped region 10d with the silicide protection film 11d sandwiched in between. A portion of the silicide protection film 11d which is sandwiched between the upper electrode 32 and the impurity-doped region 10d serves as a capacitor dielectric film.

In this semiconductor device manufacturing method according to the third preferred embodiment of the present invention, since the impurity-doped region 10d has a high impurity concentration in the upper part, no depletion of the impurity-doped region 10d occurs at the interface with the silicide protection film 11d. Further, since the upper electrode 32 is formed of metal film, no depletion of the upper electrode 32 occurs at the interface with the silicide protection film 11d. Therefore, a high-performance capacitor can be produced which has no variations in capacitance even with changes in the applied voltage or temperature.

Besides, the impurity-doped region 10d can be formed during the process step of forming the source/drain regions 10a and 10b. The silicide protection film 11d serving as a capacitor dielectric film can be formed during the process step of forming the silicide protection film 11a. The trench 30d used for the upper electrode can be formed during the process step of forming the contact holes 30a and 30b used for the plug. The upper electrode 32 can be formed during the process step of forming the plugs 31a and 31b. Therefore, no additional process steps are required for capacitor formation, which prevents an increase in the number of process steps.

Fourth Preferred Embodiment

FIGS. 27 to 31 are cross sectional views showing a sequence of process steps in a semiconductor device manufacturing method according to a fourth preferred embodiment of the present invention. First, referring to FIG. 27, the element isolation insulating films 2b, 2d and 2e, the gate electrode 5b, the impurity-doped region 10d, the sidewall 8b, the gate insulating film 9b and the source/drain regions 10b are formed in the same manner as in the aforementioned third preferred embodiment. Then, heat treatment is performed after a metal film such as cobalt is formed on the whole surface. Thereby, the silicide layers 12b1 and 12b2 are formed and the upper surface of the impurity-doped region 10d is silicided, forming a silicide layer 12d. Thereafter, an unreacted metal film is removed.

Figure 28:
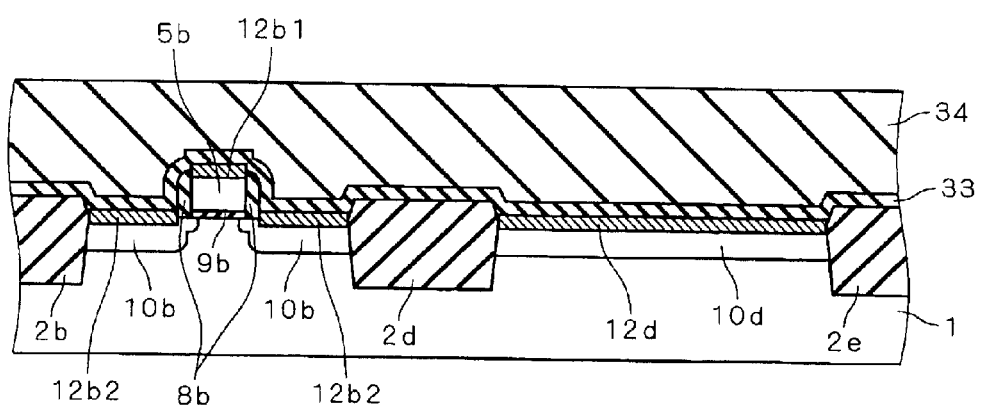

Referring next to FIG. 28, an etching stopper film 33 of silicon nitride film and an interlayer insulation film 34 of silicon oxide film are formed on the whole surface by CVD in this order.

Figure 29:
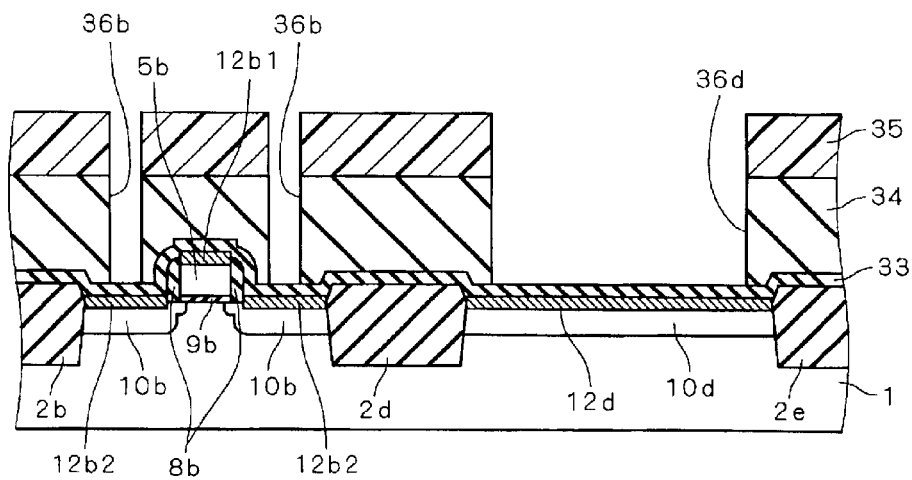

Referring next to FIG. 29, a photoresist 35 having a predetermined opening pattern is formed on the upper surface of the interlayer insulation film 34 by photolithographic techniques. Then, using the photoresist 35 as an etch mask, the interlayer insulation film 34 is removed by anisotropic dry etching until the upper surface of the etching stopper film 33 is exposed. This forms contact holes 36b above the silicide layers 12b2. Also, a trench 36d is formed above the silicide layer 12d. The bottom surfaces of the contact holes 36b and the trench 36d are defined by the upper surface of the etching stopper film 33.

Figure 30:
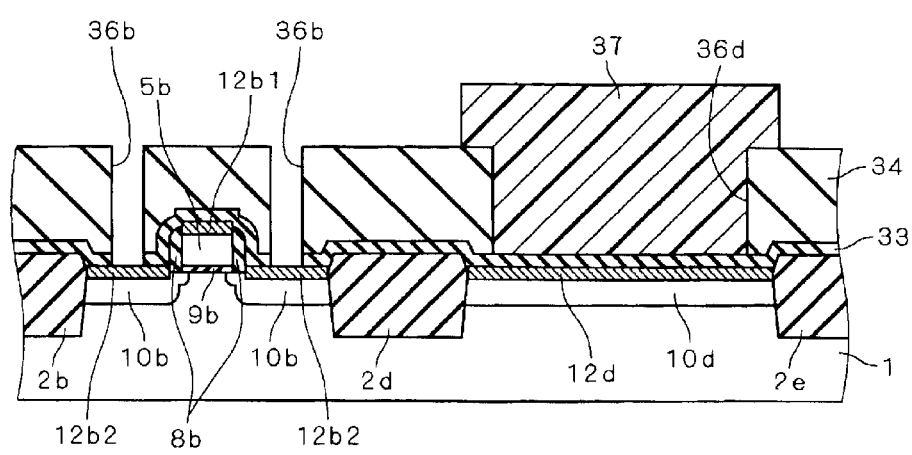

Referring next to FIG. 30, a photoresist 37 is formed by photolithographic techniques to fill in the trench 36d. An upper surface portion of the etching stopper film 33 on the silicide layer 12d is covered with the photoresist 37. Then, using the photoresist 37 as an etch mask, exposed portions of the etching stopper film 33 which are not covered with the photoresist 37 and the interlayer insulation film 34 are removed by anisotropic dry etching. Thereby, portions of the etching stopper film 33 which define the bottom surfaces of the contact holes 36b are removed and the upper surfaces of the silicide layers 12b2 are exposed. As shown in FIG. 30, the bottom surfaces of the contact holes 36b are defined by the upper surfaces of the silicide layers 12b2.

Figure 31:
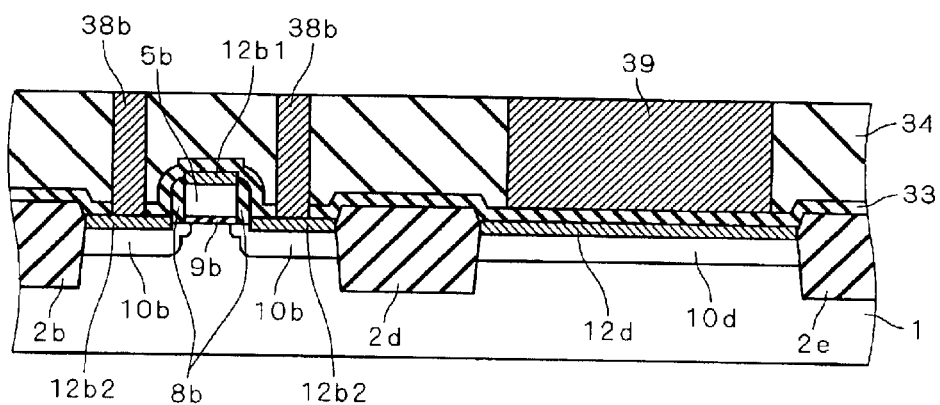

Referring next to FIG. 31, after removal of the photoresist 37, a metal film such as tungsten is formed by CVD on the whole surface to such a film thickness as to completely fill in the contact holes 36b and the trench 36d. The metal film is then removed by etch back or CMP techniques until the upper surface of the interlayer insulation film 34 is exposed. This forms plugs 38b to fill in the contact holes 36b. Also, an upper electrode 39 of the capacitor is formed to fill in the trench 36d. The upper electrode 39 is opposed to the silicide layer 12d with the etching stopper film 33 sandwiched in between. A portion of the etching stopper film 33 which is sandwiched between the upper electrode 39 and the silicide layer 12d serves as a capacitor dielectric film.

In this semiconductor device manufacturing method according to the fourth preferred embodiment of the present invention, since the impurity-doped region 10d has a high impurity concentration in the upper part and the silicide layer 12d is formed on the impurity-doped region 10d, no depletion of the impurity-doped region 10d occurs at the interface with the etching stopper film 33. Further, since the upper electrode 39 is formed of metal film, no depletion of the upper electrode 39 occurs at the interface with the etching stopper film 33. Therefore, a high-performance capacitor can be produced which has no variations in capacitance even with changes in the applied voltage or temperature.

Besides, the impurity-doped region 10d can be formed during the process step of forming the source/drain regions 10b. The etching stopper film 33 on the silicide layer 12d can be formed during the process step of forming the etching stopper film 33 on the silicide layers 12b2. The trench 36d used for the upper electrode can be formed during the process step of forming the contact holes 36b used for the plug. The upper electrode 39 can be formed during the process step of forming the plugs 38b. Therefore, no addition process steps are required for capacitor formation, which prevents an increase in the number of process steps.

Fifth Preferred Embodiment

Figure 32:
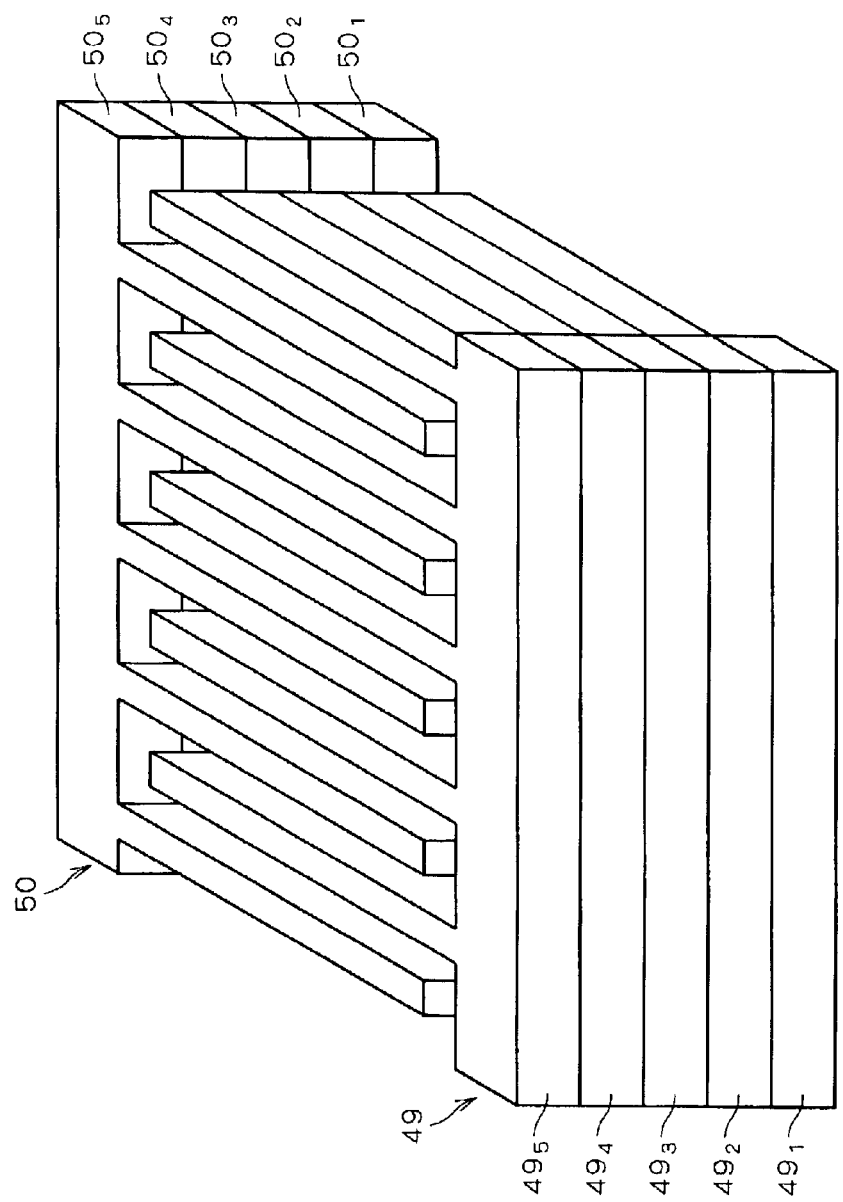
FIG. 32 is a perspective view showing a capacitor structure according to a fifth preferred embodiment of the present invention.
Figure 33:
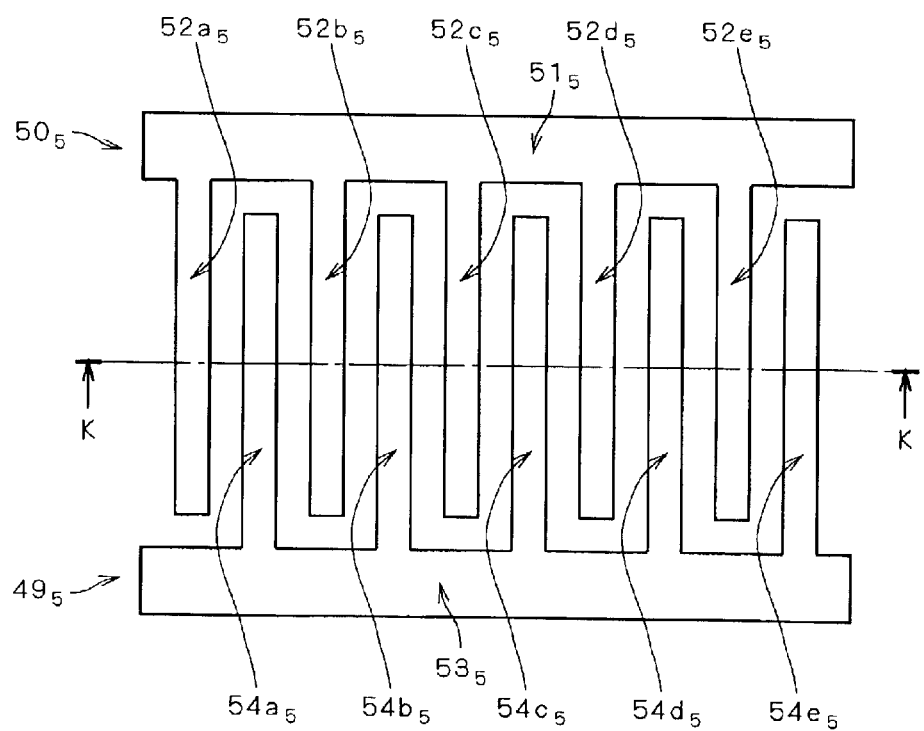
FIG. 33 is a top view showing the capacitor structure according to the fifth preferred embodiment of the present invention.

FIGS. 32 and 33 are respectively a perspective and a top views showing a capacitor structure according to a fifth preferred embodiment of the present invention. Referring to FIG. 32, a capacitor comprises a first electrode 50 and a second electrode 49. The first electrode 50 has a multilayer structure wherein comb-like structures $50_1$ to $50_5$ of the same shape are stacked one above the other in this order. The second electrode 49 has a multilayer structure wherein comb-like structures $49_1$ to $49_5$ are stacked one above the other in this order. The comb-like structures $50_1$ to $50_5$ and $49_1$ to $49_5$ are made of metal such as copper. While FIG. 32 illustrates by way of example the five-layered first and second electrodes 50 and 49, the number of layers is not limited to five but should be not less than two. The first electrode 50 and the second electrode 49 are opposed to each other with a capacitor dielectric film (not shown in FIGS. 32 and 33) sandwiched in between.

Referring to FIG. 33, the comb-like structure $50_5$ has a spine $51_5$ and a plurality of teeth $52a_5$, $52b_5$, $52c_5$, $52d_5$ and $52e_5$ connected with the spine $51_5$. The comb-like structure $49_5$ has a spine $53_5$ and a plurality of teeth $54a_5$, $54b_5$, $54c_5$, $54d_5$ and $54e_5$ connected with the spine $53_5$. The teeth $52a_5$, $52b_5$, $52c_5$, $52d_5$, $52e_5$ and the teeth $54a_5$, $54b_5$, $54c_5$, $54d_5$, $54e_5$ are arranged alternately. The spines $51_5$ and $53_5$ extend in a predetermined direction (a horizontal direction in the drawing) and the teeth $52a_5$, $52b_5$, $52c_5$, $52d_5$, $52e_5$ and the teeth $54a_5$, $54b_5$, $54c_5$, $54d_5$, $54e_5$ extend in a direction perpendicular to the above predetermined direction (a vertical direction in the drawing). Although not shown in FIG. 33, the comb-like structures $50_1$ to $50_4$ have the same configuration as the comb-like structure $50_5$ and the comb-like structures $49_1$ to $49_4$ have the same configuration as the comb-like structure $49_5$.

Figure 34:
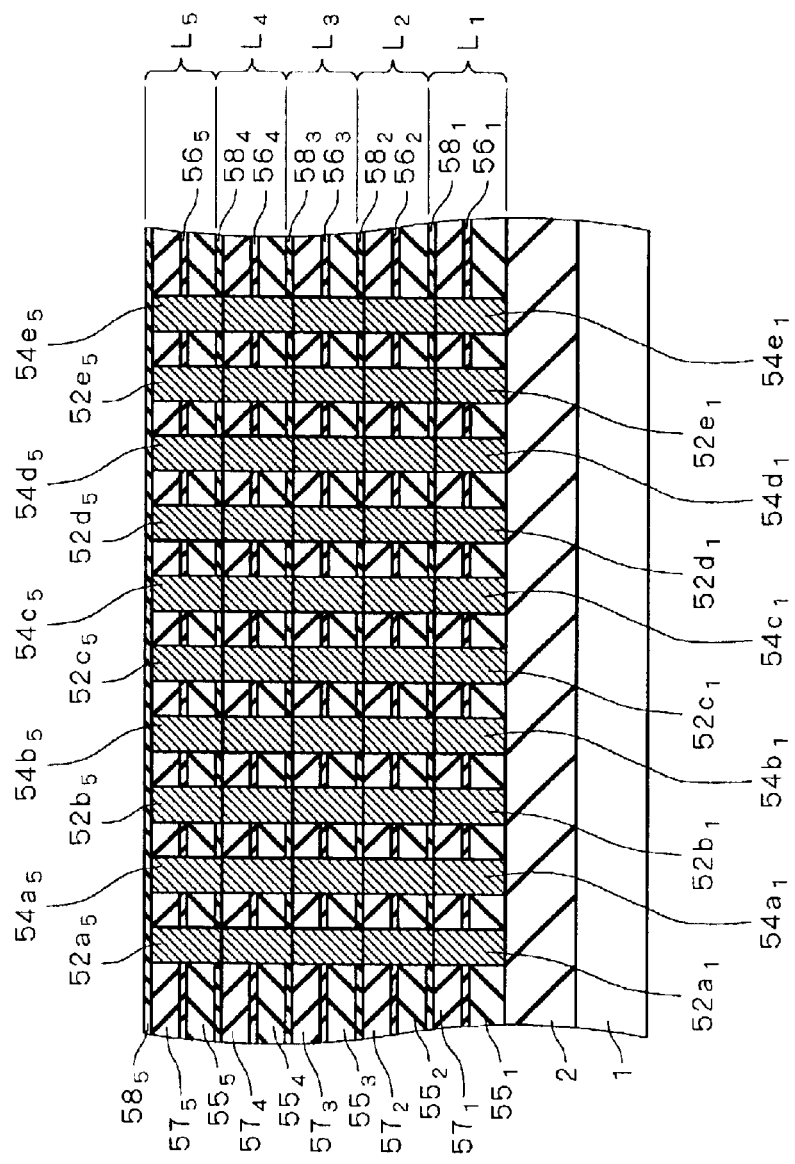
FIG. 34 is a cross sectional view of a section taken along line K—K of FIG. 33.
Figure 35:
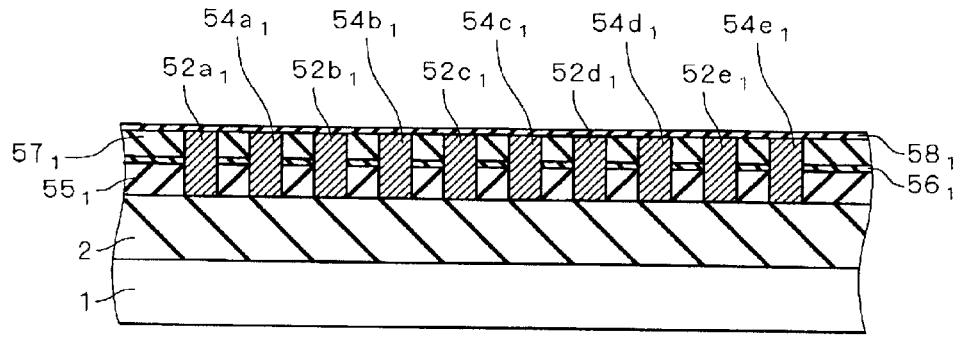
FIGS. 35 to 38 are cross sectional views showing a sequence of process steps in a method of forming a capacitor according to the fifth preferred embodiment of the present invention.

FIG. 34 is a cross sectional view of a section taken along line K—K of FIG. 33. An element isolation insulating film 2 is formed on the silicon substrate 1. On the element isolation insulating film 2, a multilayer interconnection structure is formed in which first to fifth interconnection layers $L_1$ to $L_5$ are stacked one above the other in this order. A capacitor is formed within this multilayer interconnection structure.

The first interconnection layer $L_1$ has an interlayer insulation film formed by stacking a silicon oxide film $55_1$, a silicon nitride film $56_1$, a silicon oxide film $57_1$, and a silicon nitride film $58_1$, one above the other in this order. The second to fifth interconnection layers $L_2$ to $L_5$ also have an interlayer insulation film of the same configuration. For example, the fifth interconnection layer $L_5$ has an interlayer insulation film formed by stacking a silicon oxide film $55_5$, a silicon nitride film $56_5$, a silicon oxide film $57_5$ and a silicon nitride film $58_5$ one above the other in this order.

In reference to the first interconnection layer $L_1$, the teeth $52a_1, 52b_1, 52c_1, 52d_1, 52e_1$ and the teeth $54a_1, 54b_1, 54c_1, 54d_1, 54e_1$ are formed to extend between the upper and bottom surfaces of the first interconnection layer $L_1$. The same can be said of the second to fifth interconnection layers $L_2$ to $L_5$. However, in reference to the uppermost fifth interconnection layer $L_5$, the upper surfaces of the teeth $52a_5, 52b_5, 52c_5, 52d_5, 52e_5$ and the teeth $54a_5, 54b_5, 54c_5, 54d_5, 54e_5$ are covered with the silicon nitride film $58_5$.

The teeth $52a_1, 52a_2, 52a_3, 52a_4$ and $52a_5$ are stacked one above the other in this order, forming a layered body of teeth. Similarly, the teeth $54a_1, 54a_2, 54a_3, 54a_4$ and $54a_5$ are stacked one above the other in this order, forming a layered body of teeth. The same applies to the other teeth $52b_1$ to $52b_5$, $52c_1$ to $52c_5$, $52d_1$ to $52d_5$, $52e_1$ to $52e_5$, $54b_1$ to $54b_5$, $54c_1$ to $54c_5$, $54d_1$ to $54d_5$, and $54e_1$ to $54e_5$. In a space between the adjacent layered bodies of teeth, e.g., in a space between the layered body of teeth $52a_1$ to $52a_5$ and the layered body of teeth $54a_1$ to $54a_5$, part of the interlayer insulation film is formed. This part of the interlayer insulation film serves as a capacitor dielectric film.

FIGS. 35 to 38 are cross sectional views showing, corresponding to FIG. 34, a sequence of process steps in a method of forming a capacitor according to the fifth preferred embodiment of the present invention. As will be described below, a capacitor according to the fifth preferred embodiment of the present invention is formed by a damascene process using copper. First, referring to FIG. 35, the element isolation insulating film 2 is formed on the silicon substrate 1. Then, the silicon oxide film $55_1$, the silicon nitride film $56_1$ and the silicon oxide film $57_1$ are formed on the whole surface by CVD in this order. Then, a plurality of trenches extending from the upper surface of the silicon oxide film $57_1$ to the upper surface of the element isolation insulating film 2 are formed by photolithographic and anisotropic dry etching techniques. Then, a copper film is formed on the whole surface to such a film thickness as to completely fill in those trenches. The copper film is then polished by CMP until the upper surface of the silicon oxide film $57_1$ is exposed. This forms the teeth $52a_1, 52b_1, 52c_1, 52d_1, 52e_1$ and the teeth $54a_1, 54b_1, 54c_1, 54d_1, 54e_1$ to fill in the trenches. Then, the silicon nitride film $58_1$, is formed on the whole surface by CVD.

Figure 36:
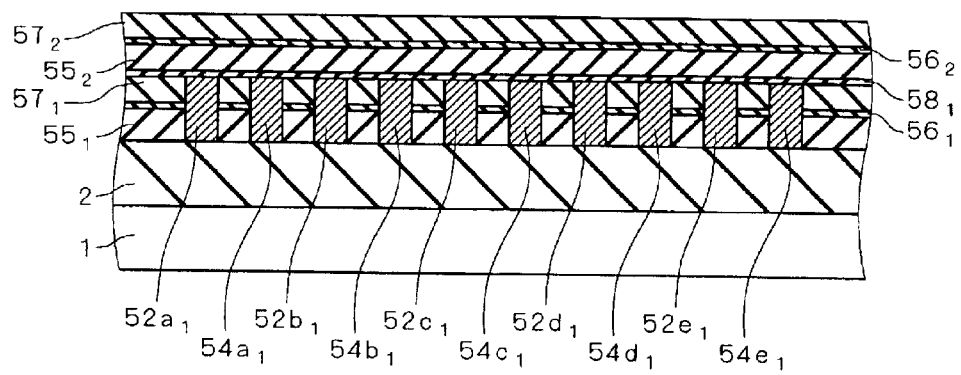

Referring next to FIG. 36, the silicon oxide film $55_2$, the silicon nitride film $56_2$ and the silicon oxide film $57_2$ are formed on the whole surface by CVD in this order.

Figure 37:
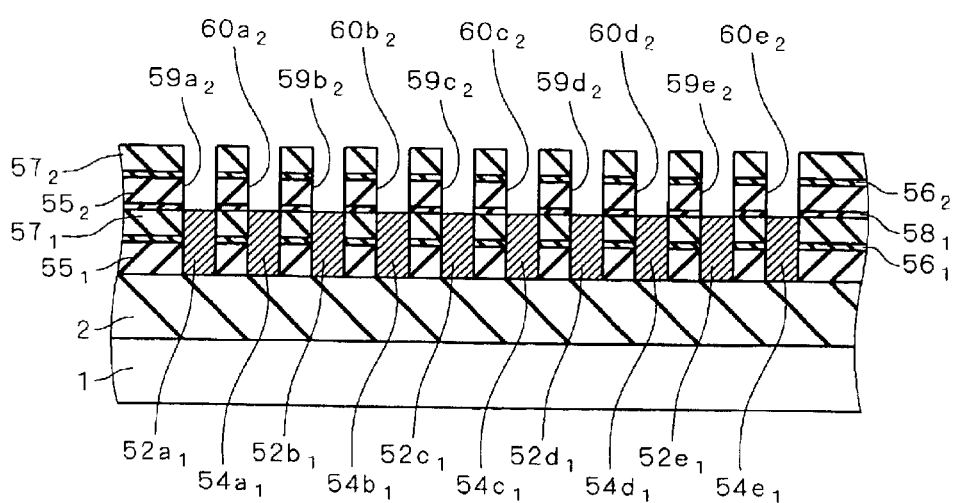

Referring next to FIG. 37, trenches $59a_2, 59b_2, 59c_2, 59d_2$ and $59e_2$ and trenches $60a_2, 60b_2, 60c_2, 60d_2$ and $60e_2$ extending from the upper surface of the silicon oxide film $57_2$ to the upper surfaces of the teeth $52a_1, 52b_1, 52c_1, 52d_1, 52e_1$, and the teeth $54a_1, 54b_1, 54c_1, 54d_1, 54e_1$, respectively, are formed by photolithographic and anisotropic dry etching techniques.

Figure 38:
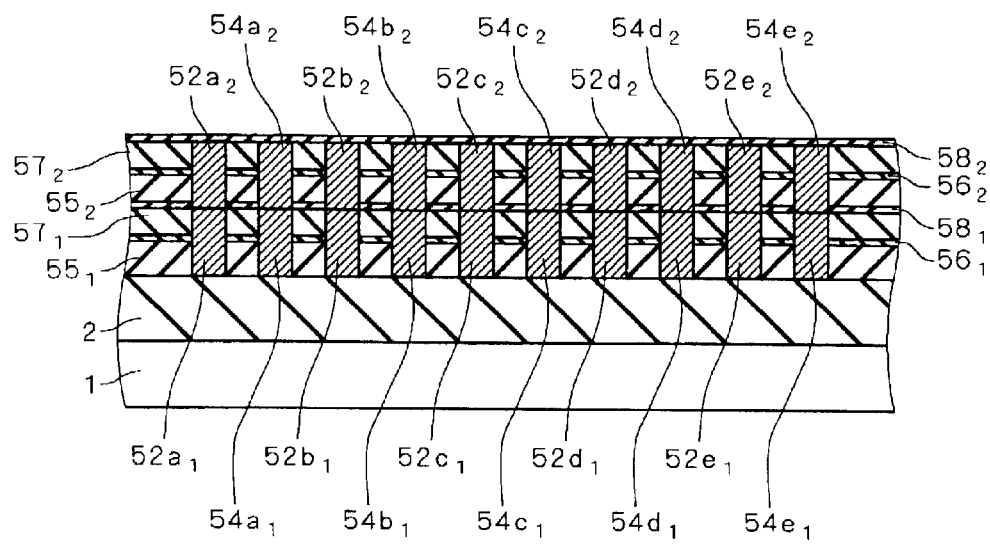

Referring next to FIG. 38, a copper film is formed on the whole surface to such a film thickness as to completely fill in the trenches $59a_2, 59b_2, 59c_2, 59d_2, 59e_2$ and the trenches $60a_2, 60b_2, 60c_2, 60d_2, 60e_2$. The copper film is then polished by CMP until the upper surface of the silicon oxide film $57_2$ is exposed. This forms the teeth $52a_2, 52b_2, 52c_2, 52d_2, 52e_2$ and the teeth $54a_2, 54b_2, 54c_2, 54d_2, 54e_2$ to fill in the trenches $59a_2, 59b_2, 59c_2, 59d_2, 59e_2$ and the trenches $60a_2, 60b_2, 60c_2, 60d_2, 60e_2$. Then, the silicon nitride film $58_2$ is formed on the whole surface by CVD.

Hereinafter, the process steps shown in FIGS. 36 to 38 are repeated for formation of the third to fifth interconnection layers $L_3$ to $L_5$, completing the structure shown in FIG. 34.

While the above description illustrates the case where the first interconnection layer $L_1$ is the lowermost layer of the capacitor, the present invention is not limited thereto; in fact, the lowermost layer of the capacitor may be the second interconnection layer $L_2$ or any of the other interconnection layers.

The aforementioned process for forming a capacitor is performed with the process for forming interconnections in transistor part. For example, the teeth $52a_2, 52b_2, 52c_2, 52d_2, 52e_2$ and the teeth $54a_2, 54b_2, 54c_2, 54d_2, 54e_2$ all belonging to the second interconnection layer $L_2$ are formed during the process for forming an interconnection of the second layer in transistor part.

In this capacitor and the forming method thereof according to the fifth preferred embodiment of the present invention, the first and second electrodes 50 and 49 of the capacitor are formed by stacking a plurality of interconnection layers of metal film having the same shape one above the other. This allows the formation of a large-capacitance capacitor.

Besides, since no additional process steps are required for capacitor formation, an increase in the number of manufacturing process steps can be prevented.

Sixth Preferred Embodiment

Figure 39:
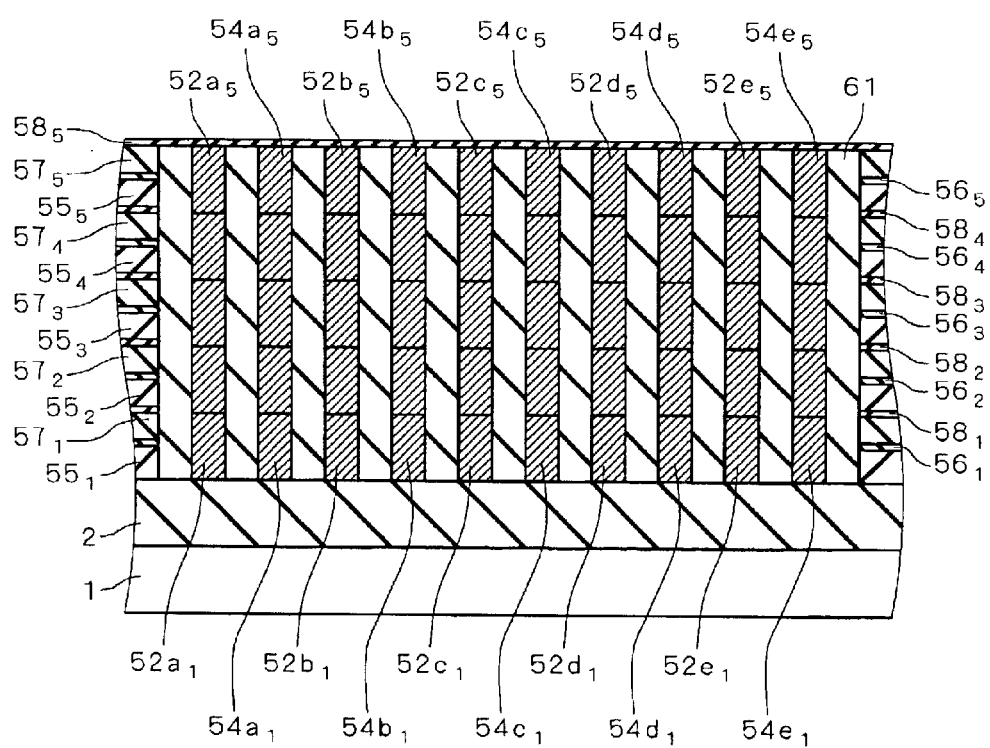
FIG. 39 is a cross sectional view showing a capacitor structure according to a sixth preferred embodiment of the present invention.
Figure 40:
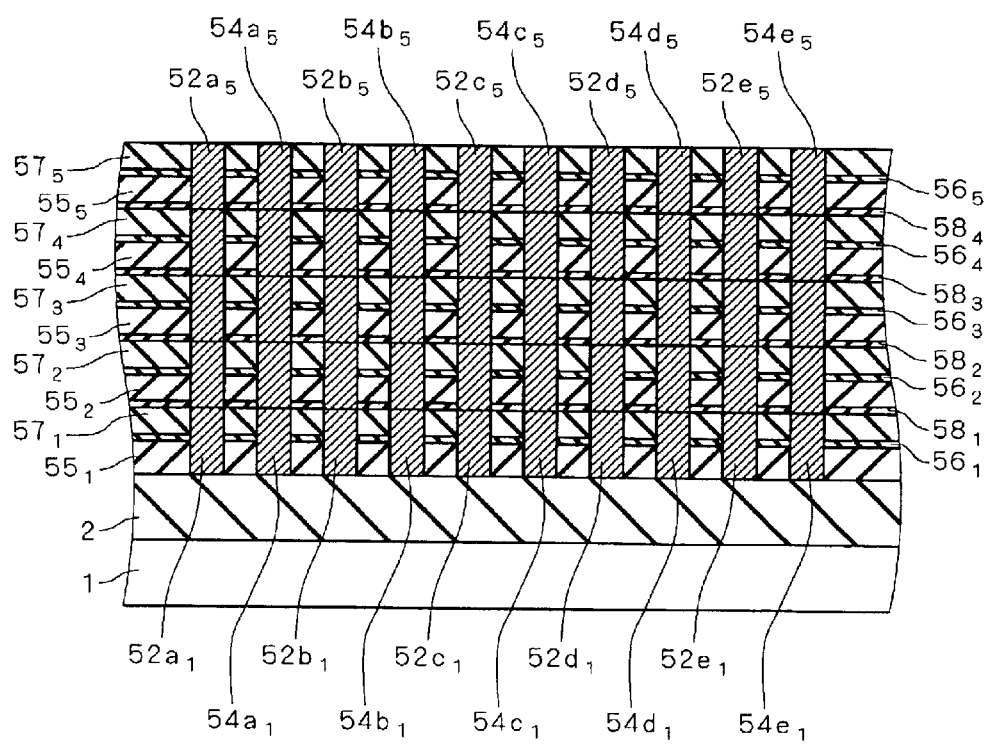

FIG. 39 is a cross sectional view showing, corresponding to FIG. 34, a capacitor structure according to a sixth preferred embodiment of the present invention. In a space between adjacent layered bodies of teeth, a high dielectric constant film 61 such as $Ta_2O_5$, $Al_2O_3$, BST or PZT is formed. The high dielectric constant film 61 has a higher dielectric constant than materials (in the present example, silicon oxide film and silicon nitride film) used for the interlayer insulation film in each interconnection layer. The high dielectric constant film 61 serves as a capacitor dielectric film. The other parts of the capacitor structure according to the sixth preferred embodiment of the present invention are similar to those of the capacitor structure according to the aforementioned fifth preferred embodiment.

FIGS. 40 to 43 are cross sectional views showing, corresponding to FIG. 39, a sequence of process steps in a method of forming a capacitor according to the sixth preferred embodiment of the present invention. First, referring to FIG. 40, the process steps leading up to the formation of the teeth $52a_5, 52b_5, 52c_5, 52d_5, 52e_5$ and the teeth $54a_5, 54b_5, 54c_5, 54d_5, 54e_5$ are performed in the same manner as in the aforementioned fifth preferred embodiment.

Figure 41:
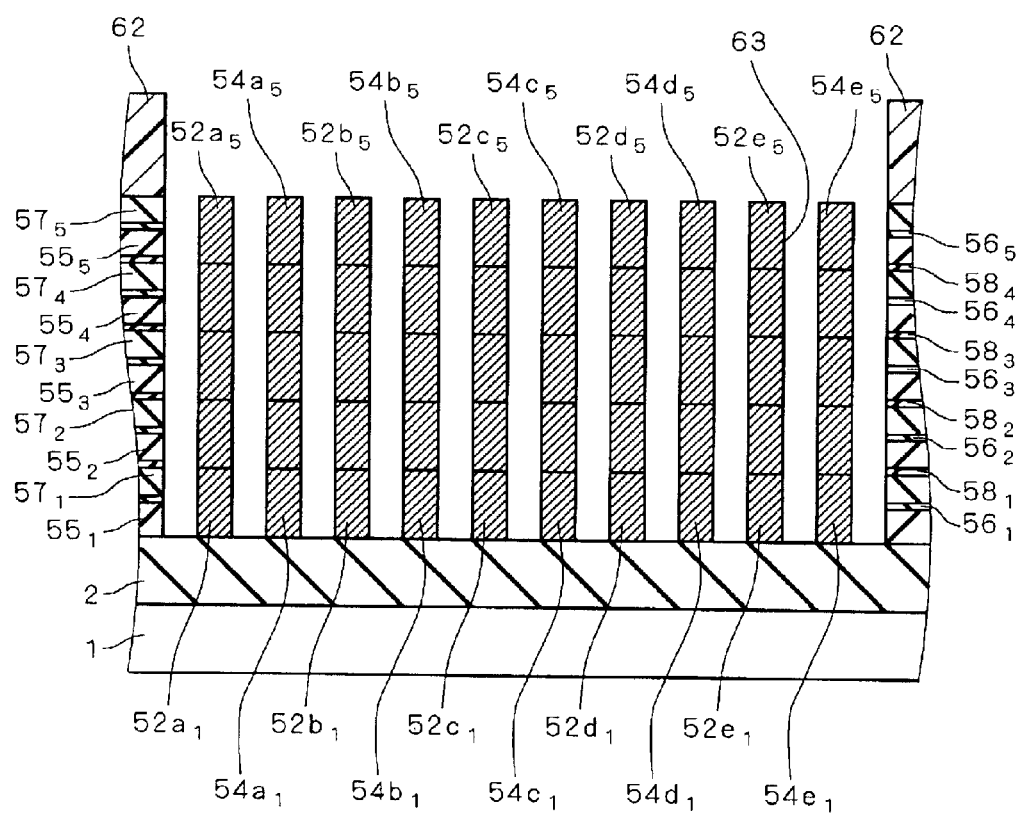

Referring next to FIG. 41, a photoresist 62 having a predetermined opening pattern is formed on the upper surface of the silicon oxide film $57_5$ by photolithographic techniques. Then, using the photoresist 62 as an etch mask, the interlayer insulation film is removed by anisotropic dry etching until the upper surface of the element isolation insulating film 2 is exposed. This forms a plurality of trenches 63 having sides defined by the layered bodies of teeth.

Referring next to FIG. 42, after removal of the photoresist 62, a high dielectric constant film 64 is formed on the whole surface by CVD to such a film thickness as to completely fill in the trenches 63.

Figure 43:
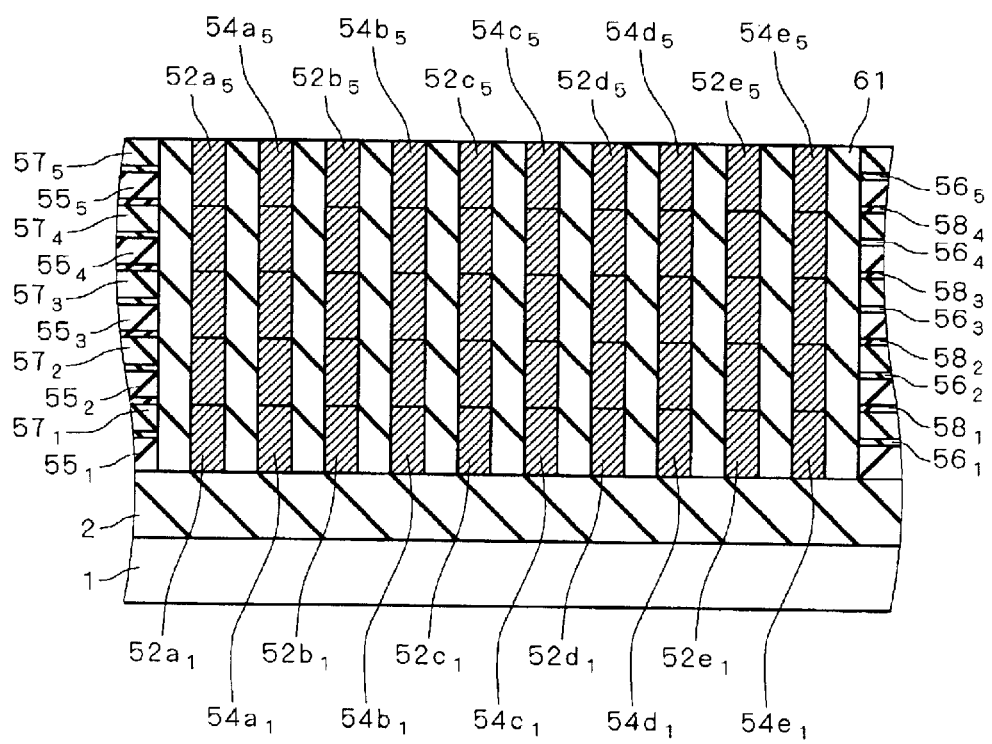

Referring next to FIG. 43, the high dielectric constant film 64 is polished by CMP until the upper surface of the silicon oxide film $57_5$ is exposed. This forms the high dielectric constant film 61 to fill in the trenches 63. Thereafter, the silicon nitride film $58_5$ is formed on the whole surface, which completes the structure shown in FIG. 39.

In this capacitor and the forming method thereof according to the sixth preferred embodiment of the present invention, the adoption of the high dielectric constant film 61 as a capacitor dielectric film achieves a larger capacitance per unit area than that of the capacitor according to the aforementioned fifth preferred embodiment.

The same effect as above described can also be achieved by applying the inventive aspect of the sixth preferred embodiment to the following seventh and eighth preferred embodiments.

Seventh Preferred Embodiment

In a multilayer interconnection structure, the pitches of interconnections (interconnection pitch), the spacings between adjacent interconnections (interconnection spacing), and the thicknesses of interconnections may differ between upper interconnection layers and lower interconnection layers. In many cases, the interconnection pitch, the interconnection spacing and the interconnection thickness for upper interconnection layers are, in general, set larger than those for lower interconnection layers. A seventh preferred embodiment of the present invention illustrates a capacitor formed in such a multilayer interconnection structure.

Figure 44:
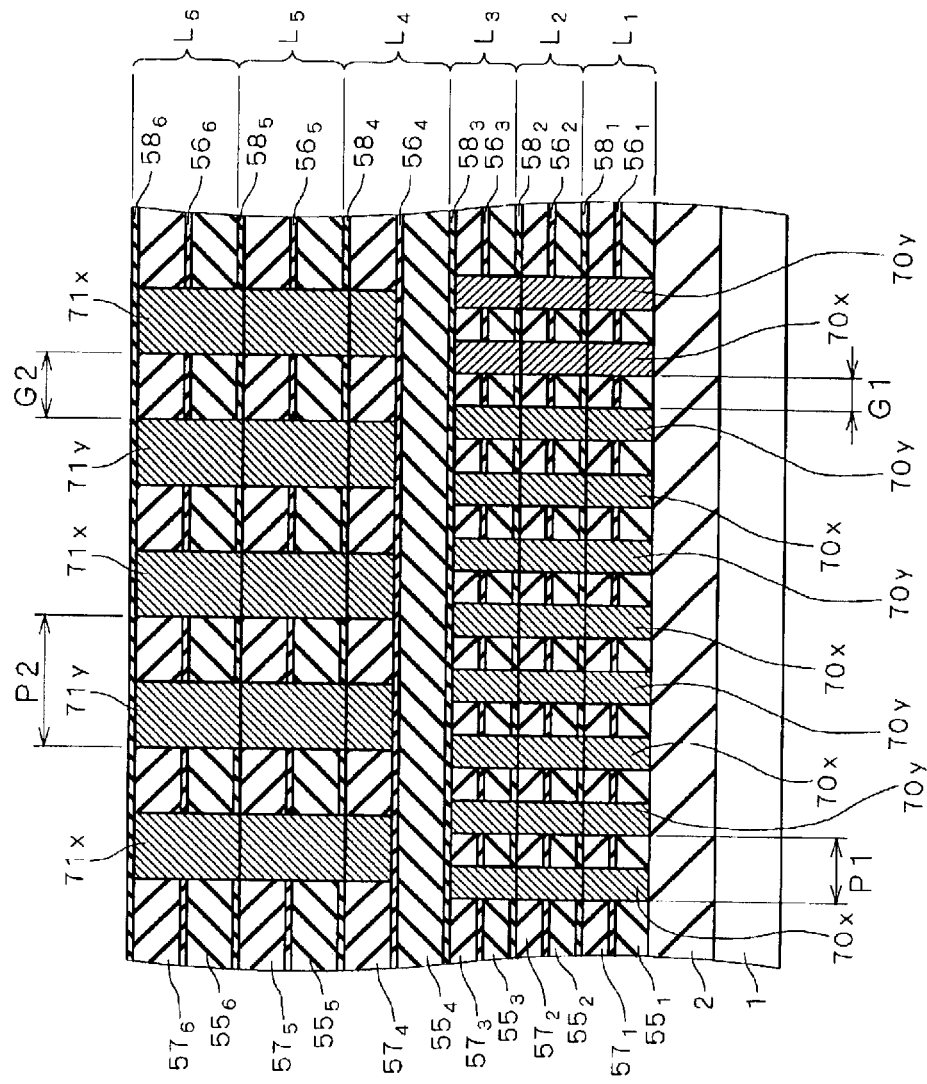
FIG. 44 is a cross sectional view showing a capacitor structure according to a seventh preferred embodiment of the present invention.

FIG. 44 is a cross sectional view showing a capacitor structure according to the seventh preferred embodiment of the present invention. An interconnection pitch P2, an interconnection spacing G2 and an interconnection thickness for upper fourth to sixth interconnection layers $L_4$ to $L_6$ are respectively larger than an interconnection pitch P1, an interconnection spacing G1 and an interconnection thickness for lower first to third interconnection layers $L_1$ to $L_3$.

Within the first to third interconnection layers $L_1$ to $L_3$, layered bodies of teeth 70x serving as a first electrode of the capacitor and layered bodies of teeth 70y serving as a second electrode are arranged alternately. As in FIG. 33, the teeth 70x are connected with the spine 51 and the teeth 70y with the spine 53.

Within the fourth to sixth interconnection layers $L_4$ to $L_6$, layered bodies of teeth 71x serving as the first electrode and layered bodies of teeth 71y serving as the second electrode are arranged alternately. As in FIG. 33, the teeth 71x are connected with the spine 51 and the teeth 71y with the spine 53.

In the fourth interconnection layer $L_4$, only a portion corresponding to an interconnection part in a damascene structure is formed and a portion corresponding to a via part is not formed. Thus, the teeth 71x and 71y in the fourth interconnection layer $L_4$ are not in direct contact with the teeth 70x and 70y in the third interconnection layer $L_3$. However, the teeth 71x in the fourth interconnection layer $L_4$ and the teeth 70x in the third interconnection layer $L_3$ are electrically connected with each other through the spine 51, while the teeth 71y in the fourth interconnection layer $L_4$ and the teeth 70y in the third interconnection layer $L_3$ are electrically connected with each other through the spine 53.

According to this seventh preferred embodiment of the present invention, a large-capacitance capacitor can be formed in a multilayer interconnection structure in which the interconnection pitches and the interconnection spacings differ between upper and lower parts.

Eighth Preferred Embodiment

Figure 45:
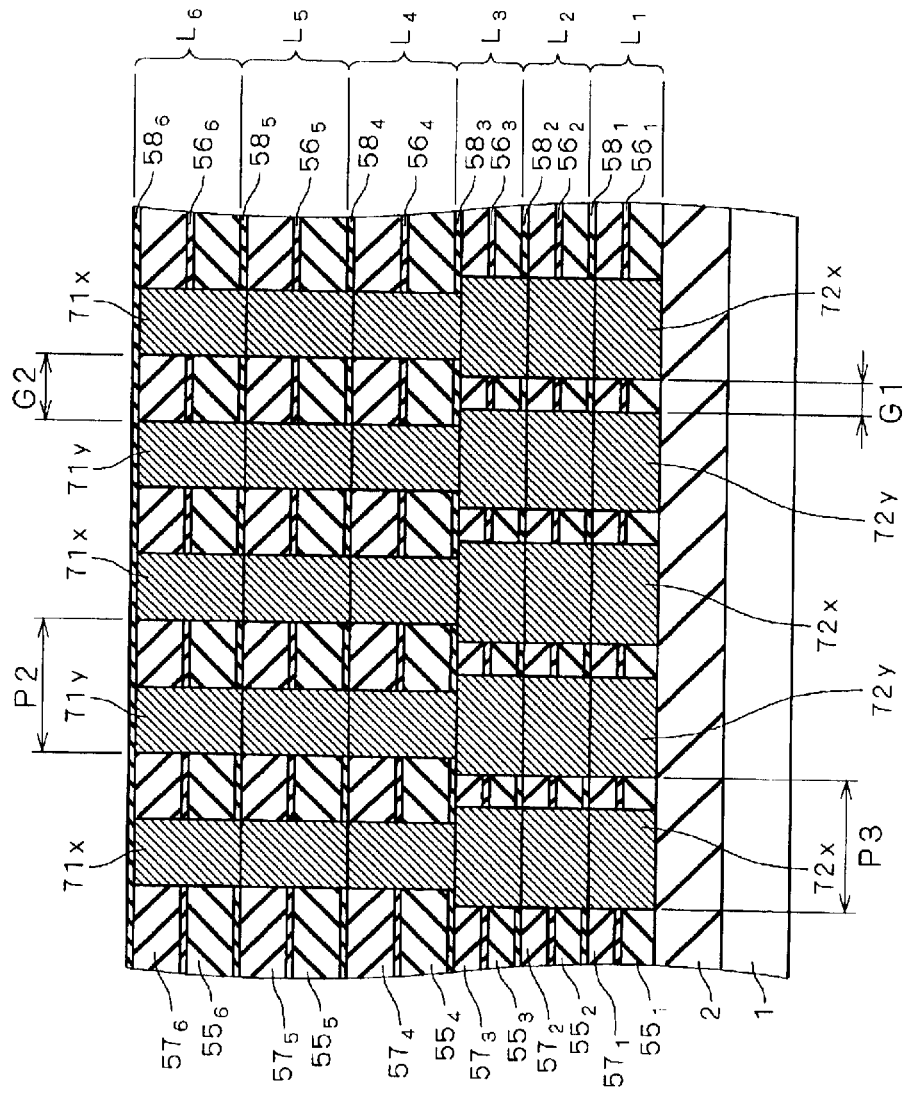
FIG. 45 is a cross sectional view showing a capacitor structure according to an eighth preferred embodiment of the present invention.
Figure 46:
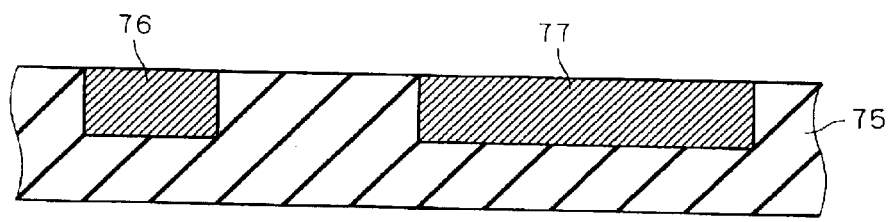
FIGS. 46 to 50 are cross sectional views showing a sequence of process steps in a semiconductor manufacturing method according to a ninth preferred embodiment of the present invention.

FIG. 45 is a cross sectional view showing a capacitor structure according to an eighth preferred embodiment of the present invention. As in the aforementioned seventh preferred embodiment, the interconnection pitch, the interconnection spacing and the interconnection thickness for upper interconnection layers are larger than those for lower interconnection layers.

Within the lower first to third interconnection layers $L_1$ to $L_3$, layered bodies of teeth 72x serving as a first electrode of the capacitor and layered bodies of teeth 72y serving as a second electrode are arranged alternately. As in FIG. 33, the teeth 72x are connected with the spine 51 and the teeth 72y with the spine 53. The teeth 72x are configured by connecting a pair of adjacent teeth 70x and 70y shown in FIG. 44. That is, while, in FIG. 44, the interlayer insulation film is formed in the space between each pair of adjacent teeth 70x and 70y, the use of a copper film instead of the interlayer insulation film forms wider teeth 72x. The same can be said of the teeth 72y. As a result, an interconnection pitch P3 for the first to third interconnection layers $L_1$ to $L_3$ is twice the interconnection pitch P1 shown in FIG. 44. Further, the interconnection pitch P3 is equal to the interconnection pitch P2 for the fourth to sixth interconnection layers $L_4$ to $L_6$.

As in the fifth interconnection layer $L_5$, the teeth 71x and 71y in the fourth interconnection layer $L_4$ are formed to extend between the upper and bottom surfaces of the fourth interconnection layer $L_4$. From this, the teeth 71x and 71y in the fourth interconnection layer $L_4$ are respectively in direct contact with the teeth 72x and 72y in the third interconnection layer $L_3$.

According to this eighth preferred embodiment of the present invention, as in the aforementioned seventh preferred embodiment, a large-capacitance capacitor can be formed in a multilayer interconnection structure in which the interconnection pitches and the interconnection spacings differ between upper and lower parts.

Ninth Preferred Embodiment

FIGS. 46 to 50 are cross sectional views showing a sequence of process steps in a semiconductor device manufacturing method according to a ninth preferred embodiment of the present invention. First, referring to FIG. 46, a metal film 76 serving as an interconnection and a metal film 77 serving as a lower electrode of the capacitor are formed in the upper surface of an interlayer insulation film 75 in any interconnection layer.

Figure 47:
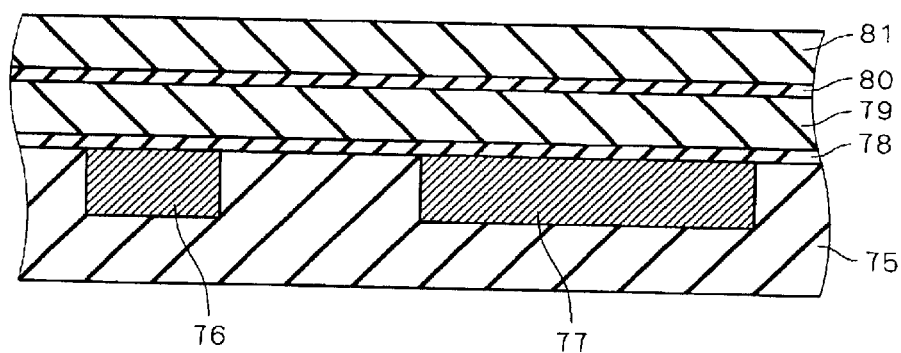

Referring next to FIG. 47, a silicon nitride film 78 serving as a capping film is formed on the whole surface by CVD. Then, a silicon oxide film 79, a silicon nitride film 80 and a silicon oxide film 81 are formed on the whole surface by CVD in this order.

Figure 48:
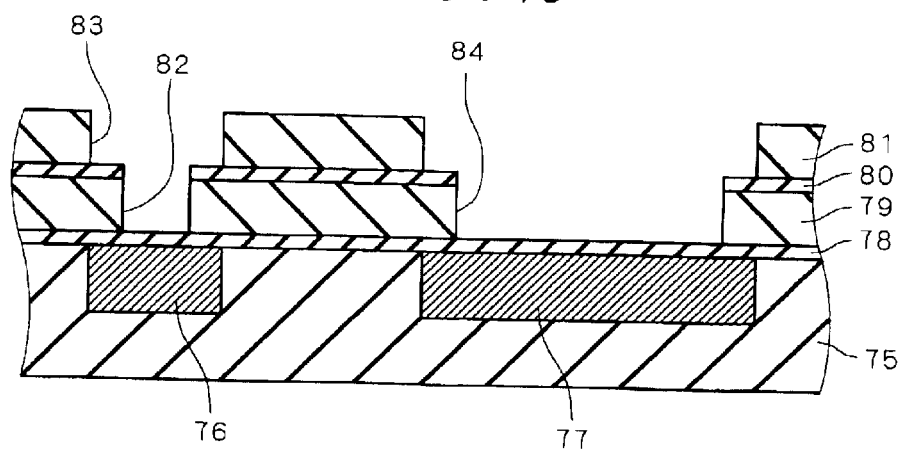

Referring next to FIG. 48, by photolithographic and anisotropic dry etching techniques, a trench 83 used for the interconnection part is formed within the silicon oxide film 81 and a trench 82 used for the via part is formed within the silicon oxide film 79 and the silicon nitride film 80. At the same time, a trench 84 used for the upper electrode of the capacitor is formed within the silicon oxide films 79 and 81 and the silicon nitride film 80. The bottom surfaces of the trenches 82 and 84 are defined by the upper surface of the silicon nitride film 78.

Figure 49:
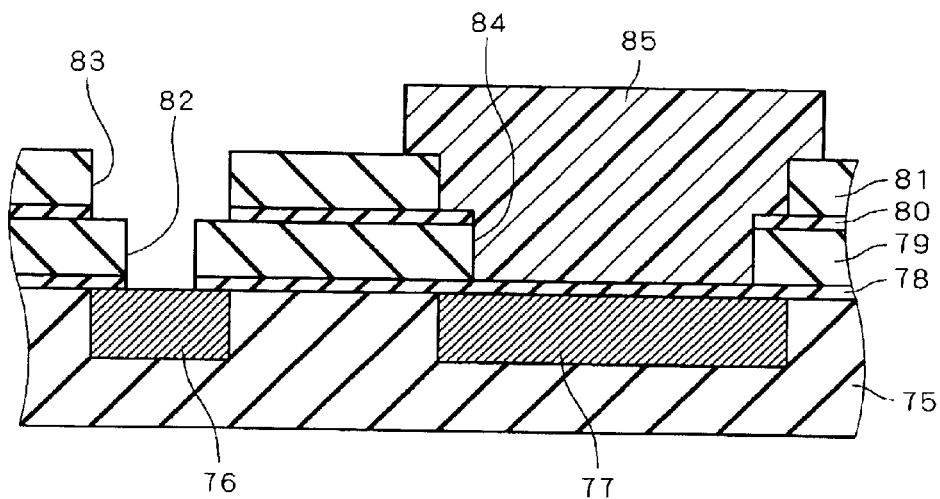

Referring next to FIG. 49, a photoresist 85 is formed by photolithographic techniques to fill in the trench 84. An upper surface portion of the silicon nitride film 78 on the metal film 77 is covered with the photoresist 85. Then, using the photoresist 85 as an etch mask, exposed portions of the silicon nitride film 78 which are not covered with the photoresist 85 and the silicon oxide film 79 are removed by anisotropic dry etching. Thereby, a portion of the silicon nitride film 78 which defines the bottom surface of the trench 82 is removed and the upper surface of the metal film 76 is exposed. At this time, exposed portions of the silicon nitride film 80 which are not covered with the photoresist 85 and the silicon oxide film 81 are also removed. As shown in FIG. 49, the bottom surface of the trench 82 is defined by the upper surface of the metal film 76.

Figure 50:
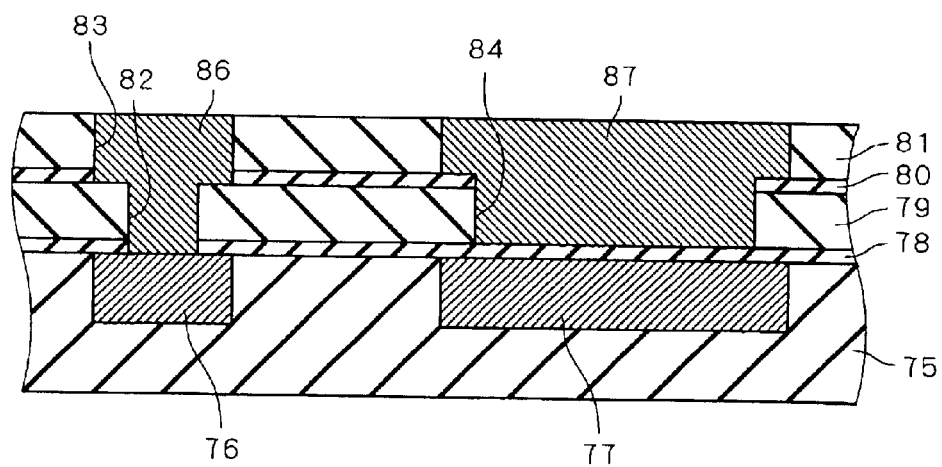
Figure 51:
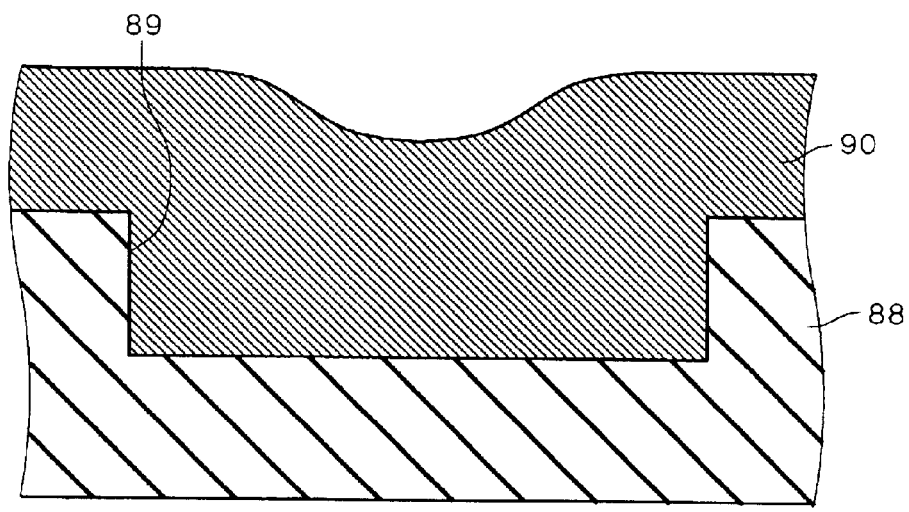
FIGS. 51 to 56 are cross sectional views showing a sequence of process steps in a method of forming a capacitor according to a tenth preferred embodiment of the present invention.
Figure 52:
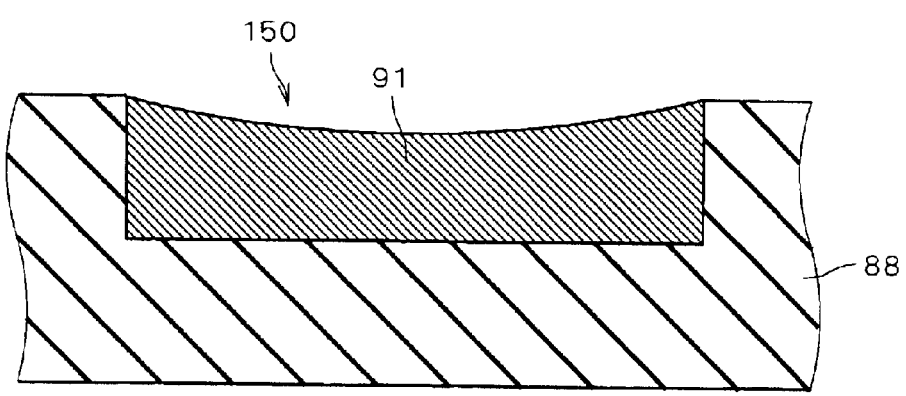

Referring next to FIG. 50, after removal of the photoresist 85, a metal film is formed on the whole surface to such a film thickness as to completely fill in the trenches 82 to 84. The metal film is then polished by CMP until the upper surface of the silicon oxide film 81 is exposed. This forms a metal film 86 to fill in the trenches 82, 83 and a metal film 87 to fill in the trench 84. The metal film 86 serves as an interconnection and the metal film 87 serves as the upper electrode of the capacitor. The metal film 87 is opposed to the metal film 77 with the silicon nitride film 78 sandwiched in between. A portion of the silicon nitride film 78 which is sandwiched between the metal films 87 and 77 serves as a capacitor dielectric film.

In this semiconductor device manufacturing method according to the ninth preferred embodiment of the present invention, the metal film 77 serving as the lower electrode can be formed during the process step of forming the metal film 76 serving as the interconnection. The trench 84 used for the upper electrode can be formed during the process step of forming the trench 83 used for the interconnection part and the trench 82 used for the via part. The metal film 87 serving as the upper electrode can be formed during the process step of forming the metal film 86 serving as the interconnection. Besides, the silicon nitride film 78 serving as a capping film for the metal film 76 is also formed on the metal film 77 and the metal film 87 is formed on a surface portion of the silicon nitride film 78 on the metal film 77; thus, that portion of the silicon nitride film 78 can serve as a capacitor dielectric film. Therefore, no additional process steps are required for capacitor formation, which prevents an increase in the number of process steps.

Tenth Preferred Embodiment

FIGS. 51 to 56 are cross sectional views showing a sequence of process steps in a method of forming a capacitor according to a tenth preferred embodiment of the present invention. First, referring to FIG. 51, a trench 89 is formed in the upper surface of an interlayer insulation film 88 in any interconnection layer by photolithographic and anisotropic dry etching techniques. Then, a metal film 90 such as copper is formed on the whole surface to such a film thickness as to completely fill in the trench 89. Then, referring to FIG. 52, the metal film 90 is polished by CMP until the upper surface of the interlayer insulation film 88 is exposed. This forms a lower electrode 91 of the capacitor in the trench 89. At this time, CMP is performed in such environments that dishing is likely to occur, whereby a central upper surface portion of the lower electrode 91 is recessed with respect to its peripheral portion, forming a recess 150. In general, it is known that dishing is likely to occur by the use of a relatively soft polishing pad.

Figure 53:
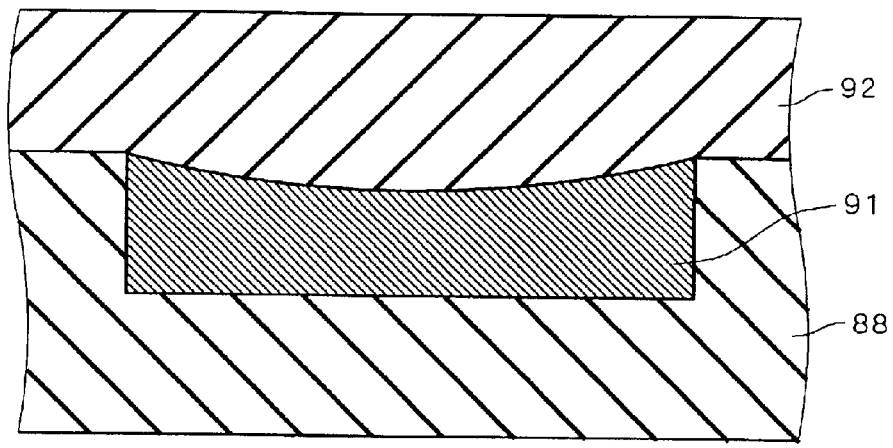

Referring next to FIG. 53, a high dielectric constant film 92 such as $Ta_2O_5$, $Al_2O_3$, BST or PZT is formed on the whole surface by CVD to fill in the recess 150.

Figure 54:
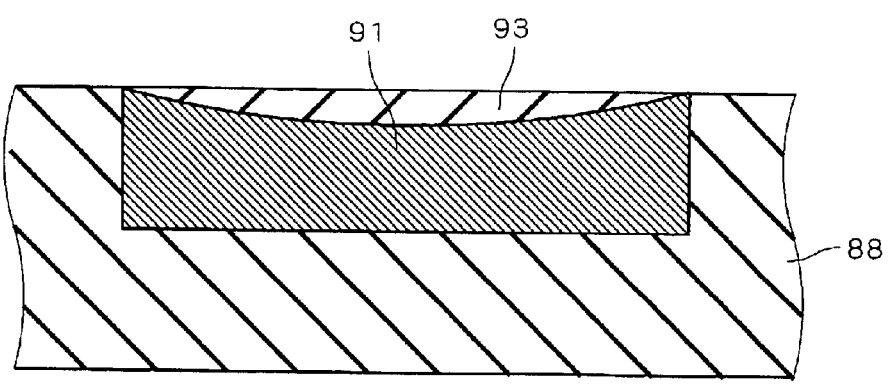

Referring next to FIG. 54, the high dielectric constant film 92 is polished by CMP until the upper surface of the interlayer insulation film 88 is exposed. At this time, CMP is performed in such environments that dishing is unlikely to occur, whereby a high dielectric constant film 93 can be formed on the upper surface of the lower electrode 91 to fill in the recess 150. To reduce the occurrence of dishing, a relatively hard polishing pad should be used.

Figure 55:
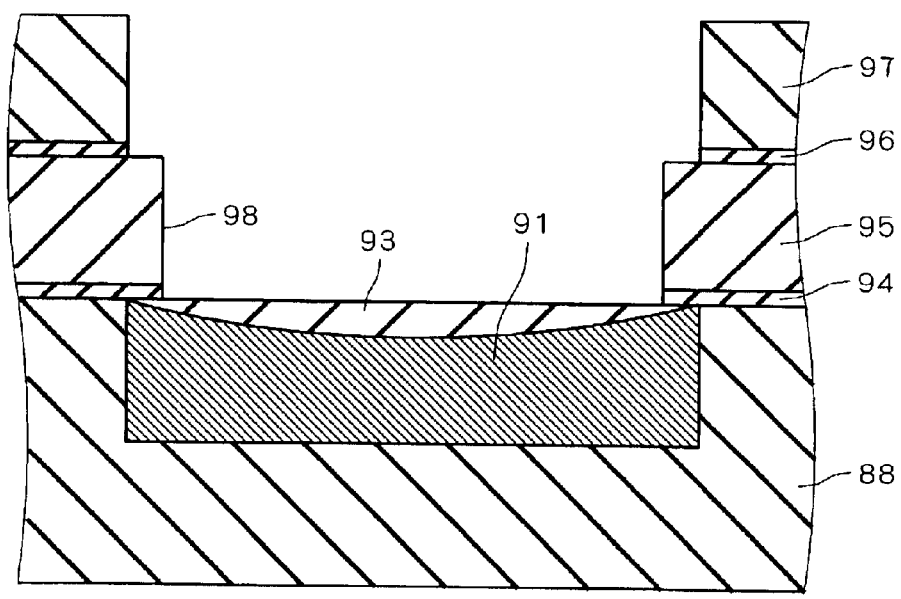

Referring next to FIG. 55, a silicon nitride film 94, a silicon oxide film 95, a silicon nitride film 96 and a silicon oxide film 97 are formed on the whole surface by CVD in this order. Then, a trench 98 extending from the upper surface of the silicon oxide film 97 to the bottom surface of the silicon nitride film 94 is formed by photolithographic and anisotropic dry etching techniques. The bottom surface of the trench 98 is defined by the upper surface of the high dielectric constant film 93. Due to the shape of the recess 150, the thickness of the high dielectric constant film 93 in the peripheral portion is thinner than that in the central portion. From this, as shown in FIG. 55, the trench 98 should preferably be formed such that the silicon nitride film 94 remains on the peripheral portion of the high dielectric constant film 93.

Figure 56:
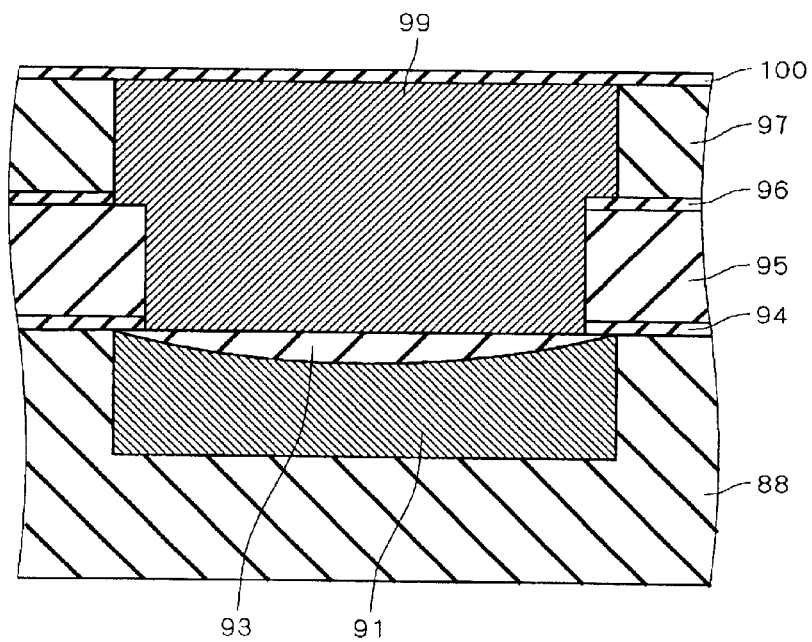
Figure 57:
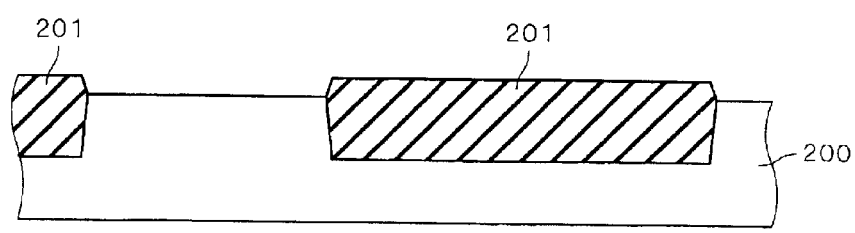
FIGS. 57 to 61 are cross sectional views showing a sequence of process steps in a first conventional semiconductor device manufacturing method.
Figure 58:
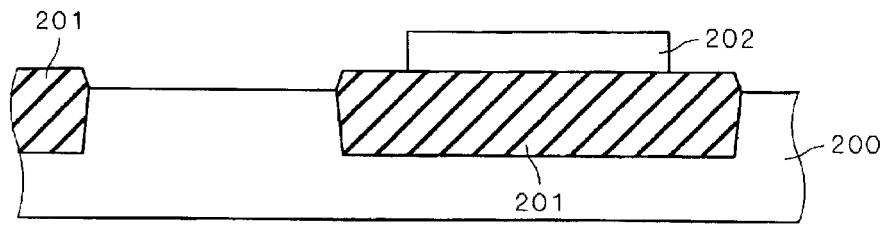
Figure 59:
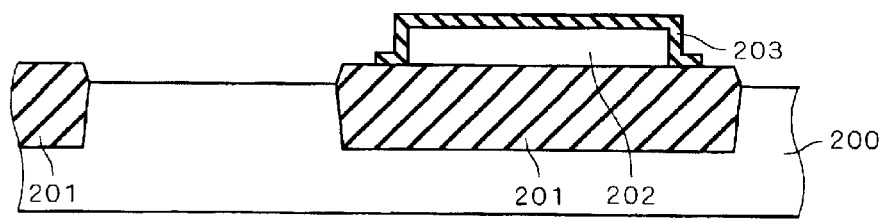
Figure 60:
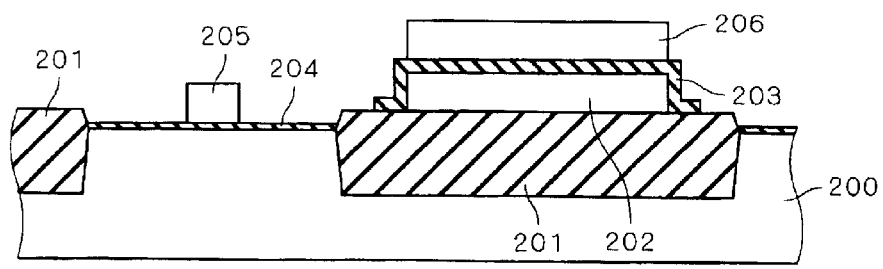
Figure 61:
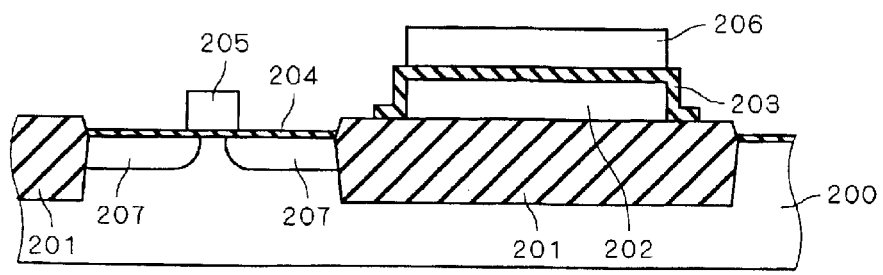
Figure 62:
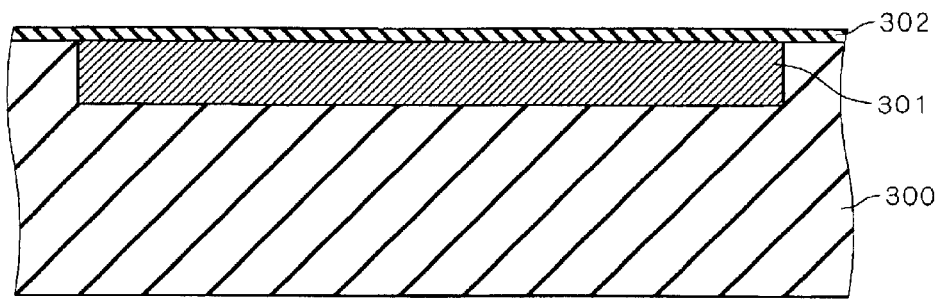
Figure 63:
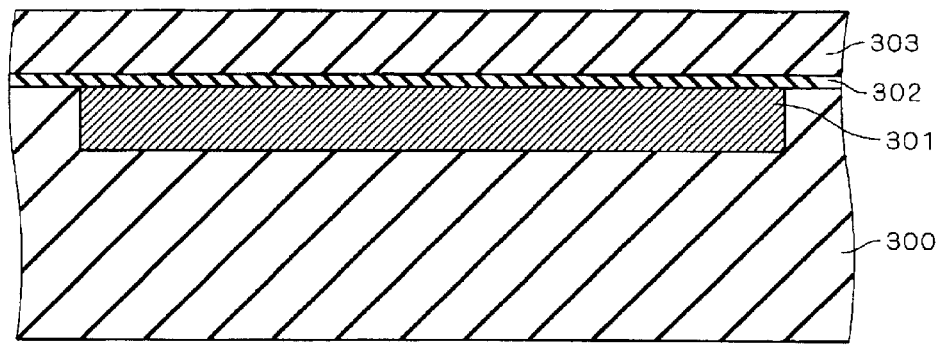
Figure 64:
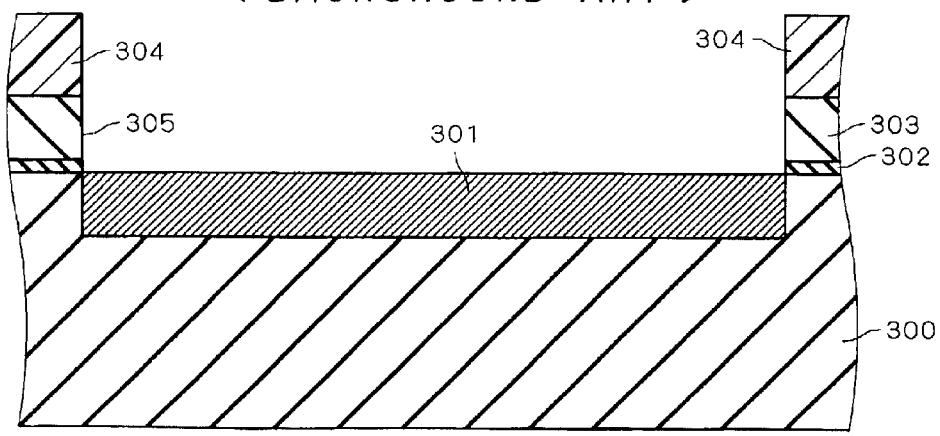

Referring next to FIG. 56, a metal film such as copper is formed on the whole surface to such a film thickness as to completely fill in the trench 98. The metal film is then polished by CMP until the upper surface of the silicon oxide film 97 is exposed. This forms an upper electrode 99 of the capacitor to fill in the trench 98. The upper electrode 99 is opposed to the lower electrode 91 with the high dielectric constant film 93 sandwiched in between. The high dielectric constant film 93 serves as a capacitor dielectric film. Then, a silicon nitride film 100 is formed on the whole surface by CVD.

In this capacitor and the forming method thereof according to the tenth preferred embodiment, the recess 150 formed in the upper surface of the lower electrode 91 is filled with the high dielectric constant film 93 for formation of a capacitor dielectric film. Thus, a capacitor dielectric film which is in firm contact with the upper surface of the lower electrode 91 can be formed without using photolithographic techniques.

Besides, without the addition of the photolithographic process, only the process for forming the high dielectric constant film 92 shown in FIG. 53 and the CMP process for the high dielectric constant film 92 shown in FIG. 54 needs to be added for capacitor formation.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:
   (a) preparing a substrate;
   (b) partially forming an element isolation film in main surface of said substrate;
   (c) forming a first semiconductor element in a first element forming region defined by said element isolation insulating film, said first semiconductor element having first source/drain regions formed in said main surface;
   (d) forming a first electrode of a capacitor;
   (e) forming a silicide protection film of insulation film to cover said first electrode, but not to cover said first semiconductor element;

(f) forming a first silicide layer by silicidation of said first source/drain regions; and (g) forming a second electrode of said capacitor which is opposed to said first electrode with said silicide protection film sandwiched in between.

2. The method according to claim 1, wherein:

said step (c) includes the steps of:

(c-1) forming a gate insulating film on said main surface; and (c-2) forming a gate electrode on said gate insulating film, in said step (d), said first electrode is formed on said element isolation insulating film, and said steps (c-2) and (d) are performed in a single step.

3. The method according to claim 1, wherein said step (c) includes the step of:

(c-1) forming said first source/drain regions by impurity introduction into said main surface, in said step (d), said first electrode is formed by impurity introduction into said main surface, and said steps (c-1) and (d) are performed in a single step.

4. The method according to claim 1, further comprising the steps of (h) forming an etching stopper film in a structure obtained by said step (f); and (i) forming an interlayer insulation film on said etching stopper film, wherein said step (g) includes the steps of:

(g-1) exposing a first portion of said etching stopper film by removing a portion of said interlayer insulation film above said first electrode;

(g-2) forming a first trench by removing said first portion, said first trench having a bottom surface defined by said silicide protection film; and (g-3) forming said second electrode by filling in said first trench.

5. The method according to claim 4, further comprising the steps of (j) exposing a second portion of said etching stopper film by removing a portion of said interlayer insulation film above said first silicide layer, said steps (j) and (g-1) being performed in a single step;

(k) forming a second trench by removing said second portion, said second trench having a bottom surface defined by said first silicide layer, said steps (k) and (g-2) being performed in a single step; and (l) forming a plug by filling in said second trench, said steps (l) and (g-3) being performed in a single step.

6. The method according to claim 4, wherein in said step (c), a second semiconductor element having second source/drain regions formed in said main surface is further formed in a second element forming region defined by said element isolation insulating film, in said step (e), said silicide protection film is formed to expose part of said second source/drain regions and to cover said second semiconductor element, and in said step (f), a second silicide layer is further formed by silicidation of an exposed portion of said second source/drain regions which is not covered with said silicide protection film, said method further comprising the steps of:

(j) exposing a second portion of said etching stopper film by removing a portion of said interlayer insulation film above said second silicide layer, said steps (j) and (g-1) being performed in a single step;

(k) forming a second trench by removing said second portion, said second trench having a bottom surface defined by said second silicide layer, said steps (k) and (g-2) being performed in a single step; and (l) forming a plug by filling in said second trench, said steps (l) and (g-3) being performed in a single step.

7. The method according to claim 1, wherein in said step (g), said second electrode is formed of metal.

8. A method of manufacturing a semiconductor device, comprising the steps of:

(a) preparing a substrate;

(b) partially forming an element isolation insulating film in a main surface of said substrate;

(c) forming a semiconductor element in a first element forming region defined by said element isolation insulating film, said semiconductor element having source/drain regions formed in said main surface;

(d) forming a first electrode of a capacitor;

(e) forming an etching stopper film of insulation film to cover said semiconductor element and said first electrode; and (f) forming a second electrode of said capacitor which is opposed to said first electrode with said etching stopper film sandwiched in between.

9. The method according to claim 8, wherein said step (c) includes the steps of:

(c-1) forming a gate insulating film on said main surface; and (c-2) forming a gate electrode on said gate insulating film, wherein in said step (d), said first electrode is formed on said element isolation insulating film, and said steps (c-2) and (d) are performed in a single step.

10. The method according to claim 8, wherein said step (c) includes the step of:

(c-1) forming said source/drain regions by impurity introduction into said main surface, in said step (d), said first electrode is formed by impurity introduction into said main surface, and said steps (c-1) and (d) are performed in a single step.

11. The method according to claim 8, further comprising the step of:

(g) forming an interlayer insulation film on said etching stopper film, wherein said step (f) includes the steps of:

(f-1) forming a first trench by removing a portion of said interlayer insulation film above said first electrode, said first trench having a bottom surface defined by a first portion of said etching stopper film; and (f-2) forming said second electrode by filling in said first trench.

12. The method according to claim 11, further comprising the steps of:

(h) exposing a second portion of said etching stopper film by removing a portion of said interlayer insulation film above said source/drain regions, said steps (h) and (f-1) being performed in a single step;

(i) forming a second trench by removing said second portion, said second trench having a bottom surface defined by said source/drain regions; and (j) forming a plug by filling in said second trench, said steps (j) and (f-2) being performed in a single step.

13. The method according to claim 11, wherein
said step (i) includes the steps of:
   (i-1) forming a mask material to cover said first portion; and
   (i-2) removing an exposed portion of said etching stopper film which is not covered with said mask material and said interlayer insulation film.

14. The method according to claim 8, wherein
in said step (f), said second electrode is formed of metal.

15. A method of manufacturing a semiconductor device, comprising the steps of:
   (a) forming in a first interconnection layer a first metal film serving as a first interconnection and a second metal film serving as a first electrode of a capacitor;
   (b) forming a capping film to cover said first and second metal films; and
   (c) forming in a second interconnection layer a third metal film serving as a second electrode of said capacitor, the second interconnection layer being formed on said first interconnection layer, said third metal film being opposed to said second metal film with said capping film sandwiched in between.

16. The method according to claim 15, further comprising the step of:
   (d) forming an interlayer insulation film of the second interconnection layer on said capping film,
wherein said step (c) includes the steps of:
   (c-1) forming a first trench by removing a portion of said interlayer insulation film above said second metal film, said first trench having a bottom surface defined by a first portion of said capping film; and
   (c-2) forming said third metal film by filling in said first trench,
said method further comprising the steps of:
   (e) exposing a second portion of said capping film by receiving a portion of said interlayer insulation film above said first metal film,
said steps (e) and (c-1) being performed in a single step;
   (f) forming a second trench by removing said second portion, said second trench having a bottom surface defined by said first metal film; and
   (g) forming a fourth metal film serving as a second interconnection by filling in said second trench,
said steps (g) and (c-2) being performed in a single step.

17. The method according to claim 16, wherein
said step (f) includes the steps of:
   (f-1) forming a mask material to cover said first portion; and
   (f-2) removing an exposed portion of said capping film which is not covered with said mask material and said interlayer insulation film.

* * * * *